(12) United States Patent
Chakraborty et al.

(10) Patent No.: US 11,502,738 B2
(45) Date of Patent: Nov. 15, 2022

(54) TRANSMITTER WITH MULTIPLE SIGNAL PATHS

(71) Applicant: International Business Machines Corporation, Armonk, NY (US)

(72) Inventors: Sudipto Chakraborty, Plano, TX (US); Rajiv Joshi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 72 days.

(21) Appl. No.: 17/149,925

(22) Filed: Jan. 15, 2021

(65) Prior Publication Data
US 2022/0231752 A1    Jul. 21, 2022

(51) Int. Cl.
*H04B 7/08*    (2006.01)
*H04B 7/06*    (2006.01)
(Continued)

(52) U.S. Cl.
CPC ............ *H04B 7/0817* (2013.01); *H03M 1/38* (2013.01); *H04B 7/0608* (2013.01); *H04B 7/0686* (2013.01); *H04B 7/15535* (2013.01)

(58) Field of Classification Search
CPC .. H04B 7/0817; H04B 7/0608; H04B 7/0686; H04B 7/15535; H04B 1/16; H04B 1/04; H04B 1/0483; H04B 1/40; H04B 1/26; H04B 7/0413; H04B 7/0404; H04B 1/005; H04B 1/006; H04B 7/0691; H04B 1/0032; H04B 1/02; H04B 1/58; H04B 1/406; H04B 1/586; H04B 1/18; H04B 1/48; H04B 1/045; H04B 7/06; H04B 1/401;
(Continued)

(56) References Cited

U.S. PATENT DOCUMENTS 3,013,148 A    12/1961    Long et al.
3,139,582 A    6/1964    Spierling
(Continued)

FOREIGN PATENT DOCUMENTS

EP    2148436 A2    1/2010
WO    PCT/EP2021/086550    4/2022

OTHER PUBLICATIONS

Motorola et al., "Load Modulation in Stage Bypass Scheme," IPCOM000131956D, Nov. 23, 2005, 3 pages.
(Continued)

*Primary Examiner* — Lana N Le
(74) *Attorney, Agent, or Firm* — Samuel Waldbaum; Ryan, Mason & Lewis, LLP

(57) ABSTRACT

An apparatus includes multiple signal paths for signal transmission, and control circuitry. The multiple signal paths include a first signal path and a second signal path. The first signal path is configured to convert a digital baseband signal to a first radio frequency (RF) signal having a first frequency and a first gain. The second signal path is configured to convert a digital baseband signal to a second RF signal having a second frequency and a second gain, wherein the second gain is less than the first gain. The control circuitry is coupled to the plurality of signal paths and is configured to receive one or more control signals to enable selective activation of at least one signal path of the plurality of signal paths.

25 Claims, 11 Drawing Sheets

(51) Int. Cl.
*H04B 7/155* (2006.01)
*H03M 1/38* (2006.01)

(58) Field of Classification Search
CPC .. H03M 1/38; H04L 25/0282; H04L 25/0272; H04L 25/028; H04L 25/0294
See application file for complete search history.

(56) References Cited

U.S. PATENT DOCUMENTS

| | | | |
|---|---|---|---|
| 6,608,860 B1 | 8/2003 | Naviasky et al. | |
| 6,625,470 B1 | 9/2003 | Fourtet et al. | |
| 6,721,368 B1 | 4/2004 | Younis et al. | |
| 8,301,086 B2 | 10/2012 | Groe et al. | |
| 8,666,336 B1* | 3/2014 | Dick | H04B 17/11 375/296 |
| 10,116,342 B2* | 10/2018 | Lee | H04B 1/0483 |
| 10,122,391 B2* | 11/2018 | Lashkarian | H03F 1/3241 |
| 2002/0039889 A1* | 4/2002 | Boos | H04B 1/406 455/84 |
| 2002/0101907 A1* | 8/2002 | Dent | H04B 1/0057 375/132 |
| 2003/0193923 A1* | 10/2003 | Abdelgany | H04B 1/005 370/320 |
| 2006/0223456 A1 | 10/2006 | Ouzillou | |
| 2006/0274815 A1* | 12/2006 | Joseph | H04B 1/719 375/130 |
| 2007/0087711 A1 | 4/2007 | Pan | |
| 2007/0270111 A1 | 11/2007 | Pan | |
| 2010/0128775 A1 | 5/2010 | Kim et al. | |
| 2011/0143791 A1* | 6/2011 | Pan | H03F 1/32 455/500 |
| 2012/0002586 A1* | 1/2012 | Gainey | H04B 1/525 370/315 |
| 2013/0322309 A1 | 12/2013 | Smith | |
| 2014/0241335 A1 | 8/2014 | Chen et al. | |
| 2015/0072740 A1* | 3/2015 | Gupta | H04B 1/0458 455/571 |
| 2016/0345317 A1* | 11/2016 | Levesque | H04W 40/02 |
| 2018/0205412 A1 | 7/2018 | Lin et al. | |
| 2018/0227925 A1* | 8/2018 | Gebhard | H04L 5/143 |
| 2018/0359077 A1* | 12/2018 | Haine | H04B 7/0602 |
| 2021/0242909 A1* | 8/2021 | Agrawal | H04B 17/13 |

OTHER PUBLICATIONS

Ip.com "Switchless Bypassing of a Balanced Power Amplifier," IPCOM000214955D Technical Disclosure, Feb. 15, 2012, 5 pages.

Y. Yin et al., "A 0.1-5.0 GHz Reconfigurable Transmitter With Dual-Mode Power Amplifier and Digitally-Assisted Self-Calibration for Private Network Communications," IEEE Transactions on Circuits and Systems I: Regular Papers, vol. 61, No. 11, Nov. 2014, pp. 3266-3277.

D. Seo et al., "A Pseudodifferential Class AB DAC for Low-Power Wireless Transmitter," IEEE Transactions on Circuits and Systems I: Regular Papers, vol. 56, No. 10, Oct. 2009, pp. 2332-2340.

* cited by examiner

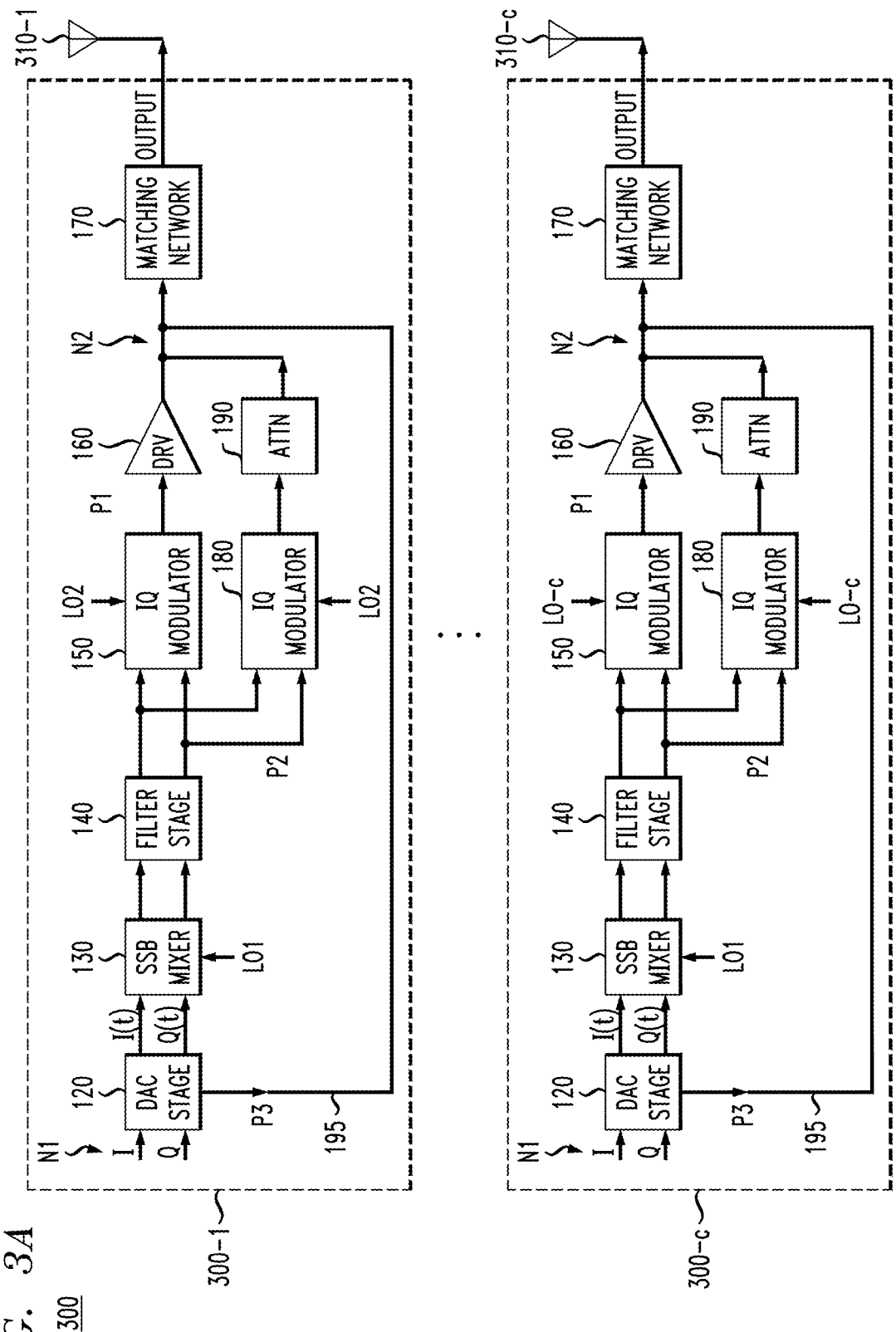

TRANSMITTER WITH MULTIPLE SIGNAL PATHS

BACKGROUND

This disclosure relates generally to low power transmitters and sensor nodes which implement low power transmitters in a sensor network.

A wireless sensor network typically comprises a plurality of sensor nodes that are distributed within a given physical environment to operate in a cooperative manner to monitor one or more physical conditions or events that occur within the given environment. In a wireless sensor network environment, it is desired to limit the power consumption of the sensor nodes when the sensor nodes operate and communicate with neighbor sensor nodes or other nodes in the network environment. In this regard, it is desired to limit the power consumption of radio frequency (RF) transmitters or transceivers which are implemented by the sensor nodes to prolong the limited power supply capacity (e.g., battery capacity) of the sensor nodes.

For example, a common approach to controlling power consumption in a transmitter is to implement various configurable components in an RF signal chain (e.g., power amplifiers, mixers, digital-to-analog converters) in which signal gain can be adjusted in baseband and/or RF stages for amplitude scaling, as needed, to optimize power consumption. For example, the gain in a transmitter channel can be adjusted by implementing a variable gain amplifier and driver which has variable gain stages that can be selectively activated to scale a baseband signal and/or scale the amplitude of RF signal, wherein the gain is programmable using digital codewords. In the transmitter, the output amplifier and driver are typically designed to support a maximum dynamic range at a highest output RF signal amplitude and to provide a desired resolution at the highest output RF signal amplitude. However, when lower power levels can be used for sufficient transmission of RF signals, the inclusion and operation of the output amplifier and driver in the RF signal chain results in unnecessary power consumption at low amplitudes, as the output amplifier and driver are not needed for low power transmission. Moreover, the inclusion and operation of the output amplifier and driver in the RF signal chain adds unnecessary signal distortion to a low power RF output signal, as a simple scaling (reduction) of the signal gain by the output amplifier and driver does not adequately reduce signal distortion.

SUMMARY

Exemplary embodiments of the disclosure include a transmitter having multiple signal paths, one or more of which can be selectively activated based on a need/desire of a system in which the transmitter will operate. For example, in one exemplary embodiment, an apparatus comprises a plurality of signal paths for signal transmission, and control circuitry. The plurality of signal paths comprises a first signal path and a second signal path. The first signal path is configured to convert a digital baseband signal to a first RF signal having a first frequency and a first gain. The second signal path is configured to convert a digital baseband signal to a second RF signal having a second frequency and a second gain, wherein the second gain is less than the first gain. The control circuitry is coupled to the plurality of signal paths and is configured to receive one or more control signals to enable selective activation of at least one signal path of the plurality of signal paths.

Another exemplary embodiment includes an apparatus which comprises a plurality of signal paths for signal transmission, and control circuitry. The plurality of signal paths comprises a first signal path and a second signal path. The first signal path is configured to convert a digital baseband signal to a first RF signal having a first frequency and a first gain. The second signal path is configured to convert a digital baseband signal to a second RF signal having a baseband frequency and a second gain which is less than the first gain. The control circuitry is coupled to the plurality of signal paths and is configured to receive one or more control signals to enable selective activation of at least one signal path of the plurality of signal paths.

Advantageously, the different signal paths can be selectively activated or deactivated to transmit data at a target RF frequency and/or gain (RF power), as needed for a given application, to minimize power consumption.

Other embodiments will be described in the following detailed description of exemplary embodiments, which is to be read in conjunction with the accompanying figures.

BRIEF DESCRIPTION OF THE DRAWINGS

FIG. 3A schematically illustrates a multi-channel transmitter, according to an exemplary embodiment of the disclosure.

DETAILED DESCRIPTION

Exemplary embodiments of the disclosure will now be described in further detail with regard to low power transmitters, including single channel and multi-channel transmitters, which are designed to have multiple signal paths, wherein each signal path has a different gain and/or center frequency. The different signal paths can be selectively activated or deactivated to transmit data at a target RF frequency and/or gain (RF power), as needed for a given application, to minimize power consumption by the transmitter.

It is to be understood that the various features as shown in the accompanying drawings are schematic illustrations that are not drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the term "exemplary" as used herein means "serving as an example, instance, or illustration". Any embodiment or design described herein as "exemplary" is not to be construed as preferred or advantageous over other embodiments or designs.

Further, it is to be understood that the phrase "configured to" used in conjunction with a circuit, structure, element, component, or the like, performing one or more functions or otherwise providing some functionality, is intended to encompass embodiments wherein the circuit, structure, element, component, or the like, is implemented in hardware, software, and/or combinations thereof, and in implementations that comprise hardware, the hardware may comprise discrete circuit elements (e.g., transistors, inverters, etc.), programmable elements (e.g., ASICs, FPGAs, etc.), processing devices (e.g., CPUs, GPUs, etc.), one or more integrated circuits, and/or combinations thereof. Thus, by way of example only, when a circuit is defined to be configured to provide a specific functionality, it is intended to cover, but not be limited to, embodiments where the circuit is comprised of elements, processing devices, and/or integrated circuits that enable it to perform the specific functionality when in an operational state (e.g., connected or otherwise deployed in a system, powered on, receiving an input, and/or producing an output), as well as cover embodiments when the circuit is in a non-operational state (e.g., not connected nor otherwise deployed in a system, not powered on, not receiving an input, and/or not producing an output) or in a partial operational state.

Figure 1A:
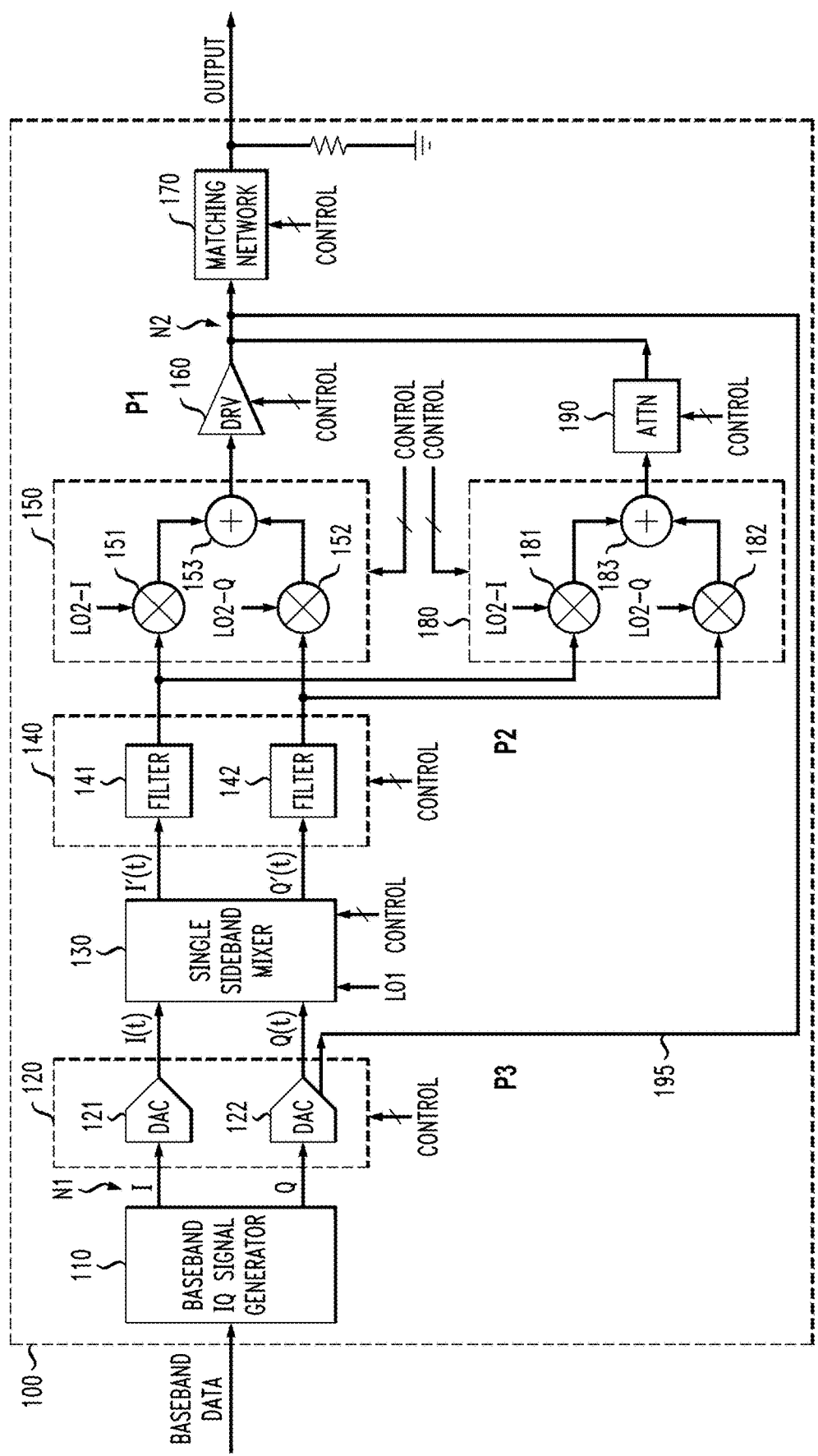
FIG. 1A schematically illustrates a transmitter, according to an exemplary embodiment of the disclosure.
Figure 1B:
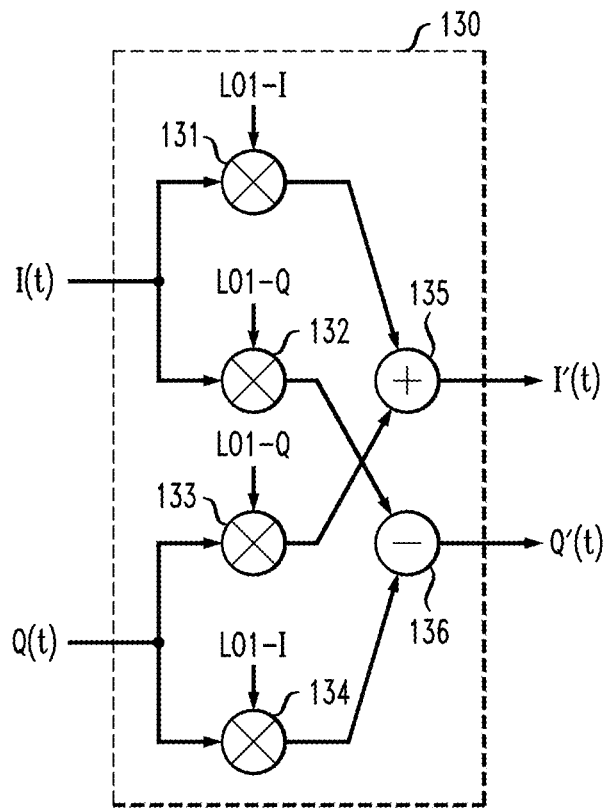
FIG. 1B schematically illustrates a single sideband modulator which is implemented in the transmitter of FIG. 1A, according to an exemplary embodiment of the disclosure.
Figure 1C:
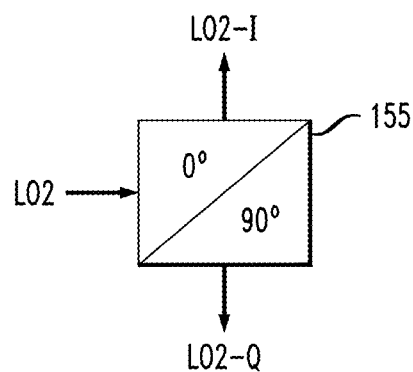
FIG. 1C schematically illustrates a quadrature phase shifter which is implemented in the transmitter of FIG. 1A to generate quadrature local oscillator (LO) signals, according to an exemplary embodiment of the disclosure.

FIGS. 1A, 1B, and 1C schematically illustrate a transmitter, according to an exemplary embodiment of the disclosure. In particular, FIG. 1A schematically illustrates a transmitter 100 comprising a single-channel transmitter, FIG. 1B schematically illustrates an exemplary embodiment of a single sideband modulator which can be implemented in the transmitter 100, and FIG. 1C schematically illustrates an exemplary embodiment of a quadrature phase shifter which can be implemented in the transmitter 100 to generate quadrature local oscillator (LO) signals.

As shown in FIG. 1A, the transmitter 100 comprises a baseband signal generator 110, a digital-to-analog converter (DAC) stage 120, a first modulation stage 130, a filter stage 140, a second modulation stage 150, an amplifier driver stage 160, an impedance matching network 170, a third modulation stage 180, a programmable gain attenuation stage 190, and an interconnect network 195. The DAC stage 120 comprises an input that is coupled to an input node N1, the first modulation stage 130 comprises an input that is coupled to an output of the DAC stage 120, the filter stage 140 comprises an input that is coupled to an output of the first modulation stage 130, the second modulation stage 150 comprises an input that is coupled to an output of the filter stage 140, the amplifier driver stage 160 comprises an input that is coupled to an output of the second modulation stage 150, and an output that is coupled to an output node N2.

In addition, the third modulation stage 180 comprises an input that is coupled to the output of the filter stage 140, and the programmable gain attenuation stage 190 comprises an input that is coupled to an output of the third modulation stage 180, and an output that is coupled to the output node N2. Further, the DAC stage 120 has an output that is coupled to the output node N2 via the interconnect network 195. In some embodiments, the interconnect network 195 comprises a network of interconnect traces and a network of passive components (discrete and/or distributed components) such as resistors R, capacitors C, and/or inductors L. In some embodiments, the interconnect network 195 is configured to provide a filtered connection between the output of the DAC stage 120 and the output node N2.

As further shown in FIG. 1A, the transmitter 100 comprises a plurality of signal paths (denoted P1, P2, P3) between the input node N1 and the output node N2. For example, in some embodiments, the transmitter 100 comprises a first signal path P1 that is configured to convert a digital baseband signal, which is present at the input node N1, to a first RF signal having a first frequency and a first gain. In particular, in the exemplary embodiment of FIG. 1A, the first signal path P1 comprises the DAC stage 120, the first modulation stage 130, the filter stage 140, the second modulation stage 150, and the amplifier driver stage 160.

Further, in some embodiments, the transmitter 100 comprises a second signal path P2 that is configured to convert a digital baseband signal, which is present at the input node N1, to a second RF signal having a second frequency and a second gain, wherein the second gain is less than the first gain of the first path P1. In particular, in the exemplary embodiment of FIG. 1A, the second signal path P2 comprises the DAC stage 120, the first modulation stage 130, the filter stage 140, the third modulation stage 180, and the gain attenuation stage 190. In some embodiments, the first and second paths P1 and P2 are configured to operate with the same LO frequencies to thereby generate output RF signals having substantially the same frequency. In some embodiments, the first and second paths P1 and P2 are configured to operate with different LO frequencies to thereby generate respective output RF signals having different frequencies, e.g., the RF output signals generated in the first path P1 have a frequency which is greater than the frequency of the RF output signals generated in the second path P2.

Moreover, in some embodiments, the transmitter 100 comprises a third signal path P3 (referred to herein as a "baseband path") that is configured to convert a digital baseband signal, which is present at the input node N1, to a third RF signal having a baseband frequency, wherein the baseband frequency is less than the frequency of RF signals generated in the first and second signal paths P1 and P2. In the exemplary embodiment of FIG. 1A, the third signal path P3 comprises the DAC stage 120 and the interconnect network 195 which couples the output of the DAC stage 120 to the output node N2. As noted above, in some embodiments, the interconnect network 195 comprises a RLC network which essentially serves as a filter stage to filter analog baseband output signals which are output from the DAC stage 120 as passed to output node N2 when the baseband signal path of the transmitter 100 is selectively activated for operation.

In the exemplary embodiment of FIG. 1A, the different signal paths P1, P2, and P3 of the transmitter 100 have different gain factors and/or RF frequencies and, consequently, the different signal paths of the transmitter 100 have different amounts of power consumption. Depending on the application and/or the environment in which the transmitter 100 is deployed, at least one of the signal paths can be selectively activated as needed to transmit data at a desired frequency and/or power level (e.g., gain). For example, when a high RF transmission power and/or a high RF transmission frequency is needed, the first signal path P1 (referred to herein as a "high gain path") can be selectively activated for operation to generate the RF output signals. On the other hand, when a lower RF transmission power and/or a lower RF transmission frequency is needed to adequately transmit data, the second signal path P2 or the third signal path P3 can be selectively activated to generate the RF output signals with a lower RF transmission power and/or a lower RF transmission frequency (as compared to the first signal path P1) and thereby minimize power consumption of the transmitter 100.

For example, when a lower RF transmission power and/or a lower RF transmission frequency is needed, the second signal path P2 (referred to herein as a "low gain path") can be selectively activated for operation to reduce the power consumption of the transmitter 100, relative to the higher power consumption of the transmitter 100 when the first signal path P1 is active. Furthermore, when an ultra-low RF transmission power and/or a baseband RF transmission frequency is needed to transmit data, the third signal path P3 can be selectively activated for operation to achieve a minimal power consumption by the transmitter 100.

As shown in FIG. 1A, the various stages 120, 130, 140, 150, 160, 170, 180, and 190 of the transmitter 100 comprise control signal input ports that receive digital control signals from a microcontroller which is configured to control operation of the transmitter 100. In some embodiments, some or all of the stages 120, 130, 140, 150, 160, 170, 180, and 190 have a configurable hardware framework in which various operating parameters of the stages can be adjusted by the digital control signals. Furthermore, in some embodiments, the active components of the various stages (or active stages) within the signal paths have control circuitry that is configured to control powering up and powering down of the active stages (in response to the digital control signals) to thereby selectively activate at least one of the signal paths which is to be utilized by the transmitter 100 for converting digital baseband signals, which are present at the input node N1, to RF signals that are output to the output node N2.

More specifically, in some embodiments, a given signal path is selectively activated by powering up the chain of active stages that make up the given signal path, while powering down the active stages in other signal paths to thereby deactivate the other signal paths that are not in use. For example, the first signal path P1 (high gain path) can be activated by powering up the DAC stage 120, the first modulation stage 130, the filter stage 140 (in instances where the filter stage 140 comprises active components), the second modulation stage 150, and the amplifier driver stage 160, while powering down the third modulation stage 180, and the programmable gain attenuation stage 190. Further, the second signal path P2 (low gain path) can be activated by powering up the DAC stage 120, the first modulation stage 130, the filter stage 140 (in instances where the filter stage 140 comprises active components), the third modulation stage 180, and the programmable gain attenuation stage 190, while powering down the second modulation stage 150 and the amplifier driver stage 160. The third signal path P3 (baseband path) can be activated by powering up the DAC stage 120 and switchably connecting the output of the DAC stage 120 to the interconnect network 195, while powering down all other stages 130, 140, 150, 160, 180, and 190.

In some embodiments, the control circuitry for controlling the powering up and the powering down of some or all of the active stages within the signal paths can be implemented using an open drain circuit topology, as is known in the art. In other embodiments, the active stages can be powered up or powered down by implementing switching circuitry that is configured to control the flow of quiescence current (or operating current) of active components of the various stages such that a given active stage can be powered down by cutting off the flow of operating current.

In the context of the exemplary embodiments discussed herein, an RF signal comprises a signal which has a frequency ranging from, e.g., about 20 kHz to about 300 GHz, such that the energy of oscillating signals (e.g., current signals) at RF frequencies can radiate from a conductor into space as radio waves. In some embodiments, the transmitter 100 comprises a quadrature transmitter which is configured to process quadrature signals (or IQ signals). As is known in the art, a quadrature signal comprises an in-phase (I) signal component, and a quadrature-phase (Q) signal component. A pair of signals that are in quadrature have the same frequency, but differ in phase by 90 degrees. For illustrative purposes, exemplary embodiments of the disclosure will be described in the context of quadrature transmitter systems, although other types of transmitter signal processing and modulation techniques can be implemented with transmitters having multiple signal processing paths.

In some embodiments, as shown in FIG. 1A, the transmitter 100 comprises an RF analog quadrature transmitter. The baseband signal generator 110 is configured to receive baseband data as input (e.g., sensor data) and generate digital quadrature signals I and Q which represent the input baseband data. In this process, the baseband data that is input to the baseband signal generator 110 is separated into two orthogonal digital components including an in-phase (I) baseband component and a quadrature-phase (Q) baseband component. In some embodiments, the baseband signal generator 110 implements digital signal processing techniques based on a combination of hardware and software to generate the digital quadrature baseband signals I and Q.

In some embodiments, the input baseband data comprises digital baseband data which is generated by another signal processor that is configured to process output signals from sensors devices and generate the baseband data. In other embodiments, the functions of the baseband signal generator 110 can be implemented in a separate digital signal processor which perform various functions including, but not limited to, digital signal processing the sensor data received from the sensor and generating the quadrature baseband IQ signals. In this regard, while the exemplary embodiment of FIG. 1A illustrates the baseband signal generator 110 as a component of the transmitter system 110, it is to be understood that in other embodiments, the baseband signal generator 110 is a system component (e.g., digital signal processor) that is separate from the transmitter 100.

The DAC stage 120 is configured to convert a digital baseband signal (e.g., digital IQ signal), which is applied to the input node N1, to an analog baseband signal having a baseband frequency. In particular, the DAC stage 120 comprises a first DAC circuit 121 and a second DAC circuit 122. The first DAC circuit 121 is configured to convert the digital baseband component I to an analog baseband component I(t) having a baseband frequency, and the second DAC circuit 122 is configured to convert the digital baseband component Q to an analog baseband component Q(t) having the same baseband frequency, but phase-shifted by 90 degrees relative to I(t). The DAC stage 120 generates and outputs the analog baseband signals I(t) and Q(t) at a given sampling rate (fs) or sampling frequency which, in some embodiments, is in a range of about 100 kHz to about 100 MHz (e.g., range of baseband frequencies).

Based on the Nyquist Sampling Theorem, the highest output frequency $f_O$ signal a DAC with sampling frequency fs can generate is equal to half the sampling rate or $f_s/2$ (referred to as the first Nyquist zone). In the frequency domain, when generating a sinusoidal waveform of frequency $f_O$, the baseband frequency $f_O$ will appear as a spectral component at $f_O$, and there will be additional higher frequency components that are generated at the output of the DAC stage 120, which are referred to as "images" and which are a function $f_S$ and $f_O$. For example, the higher frequency components are determined as $|n \times (f_S \pm f_O)|$, where n=1, 2, 3, .... The images have the same information content as the fundamental spectral components, but at higher frequencies and at smaller amplitudes. The unwanted images are suppressed/rejected using, e.g., the downstream filter stage 140.

The first and second DAC circuits 121 and 122 can be implemented using any DAC framework which is suitable for the given application. In some embodiments, the first and second DAC circuits 121 and 122 are implemented using a current-mode DAC framework in which the analog output is a current. In some embodiments, the first and second DAC circuits 121 and 122 implement a configurable hardware framework in which various operating parameters of the DAC stage 120 can be adjusted by digital control (e.g., the digital control signals that are input to the DAC stage 120). For example, in some embodiments, the digital control can be utilized to adjust DAC operating parameters including, but not limited to, the sampling rate, analog output gain, etc. In this regard, the first and second DAC circuits 121 and 122 can be configured to have a desired gain and sampling frequency to achieve a desired RF transmission power and RF transmission frequency when the third signal path P3 (baseband path) is activated for operation in the transmitter 100.

Furthermore, a higher DAC sampling frequency can be utilized as needed to transmit baseband data and/or relax the filter response of the downstream filters of the filter stage 140. Indeed, an increase in the DAC sampling frequency results in a higher baseband RF transmission frequency (i.e., the analog baseband components I(t) and Q(t) have a higher baseband frequency). In addition, an increase in the DAC sampling frequency results in an increase in the separation between the center frequency $f_O$ of the baseband component and the center frequencies $f_S \pm f_O$ of the higher frequency images, which relaxes the required sharpness of filter cutoffs at corner frequencies of the filters. However, the higher DAC sampling rate results in increased power consumption. So, a tradeoff in power consumption with lower DAC sampling frequency, and the sharpness of the filter cutoffs at the corner frequencies of the filters are factor that are considered.

In some embodiments, the first modulation stage 130 is configured to perform complex IQ signal modulation by mixing the analog baseband components I(t) and Q(t) with a quadrature LO signal (e.g., quadrature LO1 signal) to generate and output a complex IQ signal with frequency shifted components. The first modulation stage 130 comprises an up-conversion mixer which is configured to generate analog components I'(t) and Q'(t), which have a center frequency that is greater than the baseband frequency. For example, in some embodiments, the quadrature LO1 signal of the first modulation stage 130 has a frequency in range of about 10× to about 100× the baseband frequency output from the DAC stage 120. More specifically, in some embodiments, the LO1 signal has a frequency in a range of about 10 MHz to about 100 MHz. In some embodiments, the first modulation stage 130 is implemented using an exemplary single sideband IQ modulation circuit as shown in FIG. 1B, which will be discussed in further detail below.

The filter stage 140 is configured to filter the IQ analog signal components output from the first modulation stage 130 to thereby generate filtered analog IQ signals. In particular, the filter stage 140 comprises a first filter 141 and a second filter 142. The first filter 141 is configured to filter the in-phase analog signal I'(t) output from first modulation stage 130, and the second filter 142 is configured to filter the quadrature-phase analog signal Q'(t) output from first modulation stage 130. In some embodiments, the first and second filters 141 and 142 comprise low-pass filters that are configured to pass the fundamental spectral components of the respective analog signals I'(t) and Q'(t), while suppressing the image components of the respective analog signals I'(t) and Q'(t). In some embodiments, the first and second filters 141 and 142 comprise bandpass filters that are configured to pass a desired band of higher frequency image components of the respective analog baseband components I'(t) and Q'(t), while suppressing the fundamental spectral components and other image components of respective analog baseband components I'(t) and Q'(t). In other embodiments, the first and second filters 141 and 142 comprise high pass filters, as may be desired for a given application.

In some embodiments, the filter stage 140 comprises configurable filter circuits in which, e.g., the cutoff frequencies of the filter can be adjusted, or the types of filter used can be configured. For example, in some embodiments, a bandpass filter can be configured using two low pass filters using known signal filter techniques and architectures. In some embodiments, the filter configurations are digitally controlled by digital control signals that are input to the filter stage 140. Moreover, in some embodiments, when the filter stage 140 comprises active components, the digital control signals can be utilized to power up the filter stage 140 when the first signal path P1 and/or the second signal path P2 is activated, and to power down the filter stage 140 when the third path P3 is activated for operation by the transmitter 100.

The second modulation stage 150 is configured to perform analog IQ signal modulation by mixing the filtered analog signals r (t) and Q'(t), which are output from the filter stage 140, with quadrature LO2 signals (e.g., an in-phase LO2 signal (LO2-I) and a quadrature-phase LO2 signal (LO2-Q)) to generate and output an analog RF signal (e.g., a single sideband RF output signal). The LO2-I and LO2-Q signals each have the same LO2 frequency, but the LO2-Q signal is phase-shifted by 90 degrees relative to the LO2-I signal. In some embodiments, the LO2 frequency of the second modulation stage 150 is about 10× the LO1 frequency of the first modulation stage 130. For example, in some embodiments, the LO2 frequency is in a range of 1 GHz to about 10 GHz.

The second modulation stage 150 comprises a first mixer 151, a second mixer 152, and a signal combiner 153. The first mixer 151 is configured to mix the filtered analog signal r (t) with the LO2-I signal and generate a first RF signal output. The second mixer 152 is configured to mix the filtered analog signal Q'(t) with the LO2-Q signal and generate a second RF signal output. The first and second RF signals output from the first and second mixers 151 and 152 are input to the signal combiner 153 and combined (e.g., added) to generate a single sideband RF signal output.

As is understood by those of ordinary skill in the art, as a result of the mixing operations of the first and second mixers 151 and 152, the first and second RF signals that are output from the respective first and second mixers 151 and 152 each comprise a double sideband RF signal. A double sideband signal comprises an upper sideband (USB) and a lower sideband (LSB) which are disposed at equal distances above and below the LO2 frequency. The upper sideband comprises a spectral band of frequencies that is higher than the LO2 frequency, and the lower sideband comprises a spectral band of frequencies that is lower than the LO2 frequency. The upper and lower sidebands each carry the same information content of the IQ signals. For example, assume that the filtered analog signals I'(t) and Q'(t) (i.e., the modulating signals) have a center frequency $f_M$, and that the LO2 signal has a frequency $f_{LO2}$. The first and second RF signals that are output from the first and second mixers 151 and 152 will each have (i) an upper sideband of spectral components, which is frequency-band centered at a frequency of $(f_{LO2}+f_M)$ and (ii) a lower sideband of spectral components, which is frequency-band centered at a frequency of $(f_{LO2}-f_M)$.

In some embodiments, the signal combiner 153 is configured to add the first and second RF signals which are output from the first and second mixers 151 and 152, in which case the signal combiner 153 will output the "real" lower sideband signal as a single sideband modulated RF signal (with a suppressed carrier) having a center frequency which is upconverted from the frequency flu of the modulating signals (t) and Q'(t) to a center frequency $(f_{LO2}-f_M)$ of the lower sideband. In other embodiments, the signal combiner 153 is configured to subtract the first and second RF signals which are output from the first and second mixers 151 and 152, in which case the signal combiner 153 will output the "real" upper sideband signal as a single sideband modulated RF signal (with a suppressed carrier) having a center frequency which is upconverted from the frequency $f_M$ of the modulating signals I'(t) and Q'(t) to a center frequency $(f_{LO2}+f_M)$ of the upper sideband.

In other embodiments, the second modulation stage 150 is configured as a double sideband modulator (with a suppressed carrier). More specifically, the second modulation stage 150 can be configured to provide double sideband modulation by maintaining the LO2-Q input to the second mixer at a constant zero voltage level (i.e., LO2-Q=0). In this instance, the second mixer 152 will have a zero output (i.e., no RF signal is output from the second mixer 152), and the output of the signal combiner 153 will be the double sideband RF signal output from the first mixer 151.

The amplifier driver stage 160 is configured to receive the modulated RF signal which is output from the second modulation stage 150, and amplify the modulated RF signal to a desired power level, which is output from the first modulation stage 150, and drive the output of the transmitter 110 (e.g., drive an antenna that is coupled to an output of the transmitter 100). In some embodiment, the amplifier driver stage 160 comprises a programmable gain, wherein gain can be expressed as a difference between the input power level (at the input to the amplifier driver stage 160) and the output power level (at the output of the amplifier driver stage 160) or, more specifically, as a ratio of output to input power. The amplifier driver stage 160 is implemented in the high gain signal path P1, and utilized to increase the power level of the RF output signal to a level which is sufficient to transmit (wirelessly, or wired) the modulated RF signal over a required transmission distance.

As shown in FIG. 1A, the output of the amplifier driver stage 160 is coupled to the output node N2, which is a common output node for all signal paths P1, P2, and P3. In some embodiments, the second modulation stage 150 and the amplifier driver stage 160 are integrated in a way that the second modulation stage 150 and the amplifier driver stage 160 share quiescent operating current. In some embodiments, the amplifier driver stage 160 comprises a linear power amplifier with a plurality of stages which can be selectively activated or deactivated by digital control. In some embodiments, the amplifier driver stage 160 is configured to implement gain compression methods for automatic gain control.

The amplifier driver stage 160 has a dynamic range in which the amplifier driver stage 160 is configured to efficiently operate over an optimal range of output gain (RF power) and optimal range of frequencies (bandwidth), wherein such ranges are optimized for the high gain signal path P1. More specifically, the amplifier driver stage 160 is configured to have optimal operating characteristics (e.g., gain, efficiency, linearity) over a given bandwidth (e.g., frequency band of operation). The output dynamic range denotes the range (e.g., in decibels dB) between the smallest and largest useful output power levels. The bandwidth of the amplifier driver is the range of frequencies for which the amplifier driver provides a desired performance. The efficiency is a measure of how much energy of the DC power source is usefully applied to the amplifier's output. The efficiency of the amplifier driver stage 160 is a measure of DC energy loss when it is transferred to RF power, and various techniques can be implemented to increase the efficiency of the amplifier driver stage 160. The linearity of the amplifier driver stage 160 is a measure of the signal distortion caused by the amplifier, and various linearization techniques can be implemented to minimize signal distortion.

When the transmitter 100 can operate at lower RF frequencies and/or lower RF output power within a given environment or for given application, it may be inefficient to utilize the first signal path P1, as compared to using the second signal path P2 (low gain path) or the third signal path P3 (baseband path). For example, when low or extremely low RF transmission power and/or a low RF transmission frequency is needed for a given application, the use of the amplifier driver stage 160 in such instances can result in a suboptimal transmitter operation for various reasons. For example, for a low RF transmission power and/or a low RF transmission frequency, the amplifier driver stage 160 may be inefficiently operating on the fringe or outside the optimal dynamic range of the amplifier driver stage 160. This results in an increased power consumption of the transmitter 100 and adds another source of signal distortion to the modulated RF signal that is generated and output from the first signal path P1. In this regard, to avoid the unnecessary power consumption and/or added RF signal distortion that would result from utilizing the amplifier driver stage 160 for, e.g., low power RF power output, the transmitter 100 can be configured to operate with a low RF transmission power and/or a low RF transmission frequency by activating the second signal path P2 (low gain signal path) or the third signal path P3 (baseband signal path).

In particular, as shown in FIG. 1A, the second signal path P2 can be activated by powering up the third modulation stage 180 and the programmable gain attenuation stage 190, while powering down the second modulation stage 150 and the amplifier driver stage 160. In some embodiments, the third modulation stage 180 comprises a same or similar architecture and mode of operation (e.g., single sideband or double sideband) as the second modulation stage 150 as discussed above. In some embodiments, the third modulation stage 180 operates with a same LO frequency (e.g., LO2) as the second modulation stage 150). In other embodiments, for lower frequency RF output, and thus, lower power consumption, the third modulation stage 180 can operate with an LO frequency which is less than the LO2 frequency.

The programmable gain attenuation stage 190 comprises a programmable amplifier which is configured to amplify a modulated RF signal, which is generated and output from the third modulation stage 180, with a gain factor of 1, or less than 1. In this manner, the programmable gain attenuation stage 190 can attenuate the power level of modulated RF signals that are output from the third modulation stage 180, as desired, to conserve power and achieve lower power consumption as a result of the operation of the transmitter 100.

As further shown in FIG. 1A, for even lower power consumption of the transmitter 100, the third signal path (baseband signal path) can be activated by powering down the various stages 130, 140, 150, 160, 170, and 180 of the first and second signal paths P1 and P2, and switching an output of the DAC stage 120 to the interconnect network 195 to thereby effectively couple the output of the DAC stage 120 to the output node N2. In this configuration, a baseband analog signal which is output from the DAC stage 120 can utilized as the RF signal which is output from the transmitter 100. When the transmitter 100 is operating using the third signal path P3, various operating parameters of the DAC stage 120, such as the sampling frequency, the output gain, etc., can be configured to achieve a baseband analog output signal with a desired center frequency and gain. For illustrative purposes, FIG. 1A illustrates the output of the second DAC circuit 122 (Q DAC) being switchably coupled to the interconnect network 195 when the third signal path P3 is activated. In other embodiments, the output node N2 can be connected to the output of the first DAC circuit 121 (I DAC) through the interconnect network 195. In this instance, since no IQ modulation is implemented in the third signal path P3, the output of the first DAC 121 or the output of the second DAC 121 can be utilized as the baseband output since both of the analog baseband signals I(t) and Q(t) have the same information content, and the relative phase shift is irrelevant for operation of the transmitter 100 using the third signal path P3.

The impedance matching network 170 is configured to match a source impedance or load impedance of the output stages of the different signal paths P1, P2, and P3 to a characteristic impedance of an output load (e.g., antenna input, diplexer, etc.) of the transmitter 100. In some embodiments, the impedance matching network 170 comprises a balun. In some embodiments, the output of the impedance matching network 170 is coupled to an antenna system. In some embodiments, each signal path P1, P2, and P3 comprises a respective current-mode output stage coupled to the output node N2, wherein the respective current-mode output stages provide substantially similar loading (e.g., substantially similar load impedance) on the output node N2. In particular, as shown in FIG. 1A, each signal path P1, P2, and P3 terminates at the common output node N2 at the input of matching network 170. The load impedance of the output stage of each signal path P1, P2, and P3 is substantially the same, so that the matching network 170 can match the output impedance of the signal paths to the characteristic impedance at the output of the transmitter 100 without any substantial recalibration or reconfiguration of the matching network 170.

In some embodiments, the resonance parameters (e.g., impedance and bandwidth) of the matching network 170 remain substantially invariant for the various signal paths P1, P2, and P3. For example, in some embodiments, the matching network 170 can be designed with a center frequency which corresponds to the RF transmission frequencies of the first and second signal paths P1 and P2 (e.g., 2.4 GHz). In such instance, when the third signal path P3 (baseband path) is activated, the matching network 170 would serve as a filter which passes higher frequency images of the fundamental baseband frequency of the RF signal output from the DAC stage 120, while suppressing the signals with the fundamental frequency and other harmonics.

In other embodiments, the matching network 170 is configured with a plurality of injection points to provide different impedance matching and filtering characteristics. The different injection points can be selected by digital control signals applied to the matching network 170. The matching network 170 can have high pass and low pass characteristics, wherein the different injection points can be selected to provide different impedance matching and response characteristic. In some embodiments, the impedance matching network 170 is designed with a high-Q factor, wherein the center frequency of the impedance matching network 170 can be adjusted to provide sufficient impedance matching for lower baseband frequencies (e.g., fundamental baseband frequency) which are output from the DAC stage 120 when the transmitter 100 is operating with the third signal path P3 activated.

In view of the above, it is to be appreciated that the implementation of the multiple signal paths P1, P2, and P3, allows the total dynamic range (e.g., bandwidth, and output power) of the transmitter 100 to be essentially partitioned between the multiple signal paths P1, P2, and P3, wherein each signal path is configured to provide optimal transmitter operation for a given portion of the total dynamic range of the transmitter 100. Indeed, the multiple signal paths P1, P2, and P3 allow the transmitter 100 to be efficiently operated over a wide range of RF transmission power and/or RF transmission frequencies, while minimizing power consumption. This is in contrast to conventional transmitter architectures in which a single, configurable signal path is used for different RF transmission power and/or RF transmission frequencies.

FIG. 1B schematically illustrates an exemplary embodiment of the first modulation stage 130 which can be implemented in the transmitter 100 of FIG. 1A. As noted above, in some embodiments, the first modulation stage 130 comprises a single sideband IQ modulator which is configured to perform complex IQ signal modulation by mixing the analog baseband components I(t) and Q(t) with the in-phase local oscillator signal LO1-I and the quadrature-phase local oscillator signal LO1-Q, and thereby generate and output a complex IQ baseband signal comprising an in-phase analog component I'(t) and a quadrature-phase analog component Q'(t), As demonstrated below, the analog components I'(t) and Q'(t) comprise single sideband, frequency-shifted versions of the input analog baseband components I(t) and Q(t).

As shown in FIG. 1B, the single sideband IQ modulator 130 comprises a first mixer 131, a second mixer 132, a third mixer 133, a fourth mixer 134, a first signal combiner 135, and a second signal combiner 136. The first mixer 131 is configured to mix the analog baseband signal I(t) with the LO1-I signal, and output a first double sideband RF signal to the first signal combiner 135. The second mixer 132 is configured to mix the analog baseband signal I(t) with the LO1-Q signal, and output a second double sideband RF signal to the second signal combiner 136. The third mixer 133 is configured to mix the analog baseband signal Q(t) with the LO1-Q signal, and output a third double sideband RF signal to the first signal combiner 135. The fourth mixer 134 is configured to mix the analog baseband signal Q(t) with the LO1-I signal, and output a fourth double sideband RF signal to the second signal combiner 136.

The first signal combiner 135 is configured to combine (e.g., add) the first and third double sideband RF output signals of the first and third mixers 131 and 133 to generate the single sideband in-phase analog baseband signal I'(t). The second signal combiner 136 is configured to combine (e.g., subtract) the second and fourth sideband RF output signals of the second and fourth mixers 132 and 134 to generate the single sideband in-phase analog signal Q'(t). In this configuration, the first modulation stage 130 is configured to upconvert, or otherwise frequency shift, the baseband frequency of the analog baseband components I(t) and Q(t) to higher frequency.

For example, to illustrate the IQ modulation process which is performed by the IQ modulator 130, assume that (i) the in-phase signals are cosine waveforms, (ii) the quadrature-phase signals are sine waveforms, (iii) the analog baseband components I(t) and Q(t) have a baseband frequency fB (denoted as B), and (iv) the LO1-I and LO1-Q signals have an LO frequency fio (denoted as A). With this exemplary notation, the analog baseband signal I(t) is denoted as cos(B), the analog baseband signal Q(t) is denoted sin(B), the LO1-I signal is denoted as cos(A), and the LO1-Q signal is denoted as sin(B).

Based on product-to-sum trigonometric identities, the following operations are performed by the mixers of the single sideband IQ modulator 130:

(i) the first mixer 131 mixes the analog baseband signal I(t) with the LO1-I signal by the following multiplication process: $\cos(A)\cos(B) = \frac{1}{2}[\cos(A-B)+\cos(A+B)]$;

(ii) the second mixer 132 mixes the analog baseband signal I(t) with the LO1-Q signal by the following multiplication process: $\sin(A)\cos(B) = \frac{1}{2}[\sin(A+B)+\sin(A-B)]$;

(iii) the third mixer 132 mixes the analog baseband signal Q(t) with the LO1-Q signal by the following multiplication process: $\sin(A)\sin(B) = \frac{1}{2}[\cos(A-B)-\cos(A+B)]$; and (iv) the fourth mixer 134 mixes the analog baseband signal Q(t) with the LO1-I signal by the following multiplication process: $\cos(A)\sin(B) = \frac{1}{2}[\sin(A+B)-\sin(A-B)]$.

The following operations are performed by the first and second signal combiners 135 and 136 of the single sideband IQ modulator 130. The first signal combiner 135 adds the signals that are output from the first mixer 131 and the third mixer 133 to generate the single sideband in-phase analog baseband signal I' (t), as follows:

$$I'(t) = (\tfrac{1}{2}[\cos(A-B)+\cos(A+B)]) + (\tfrac{1}{2}[\cos(A-B)-\cos(A+B)]) = \cos(A-B).$$

The second signal combiner 136 subtracts the signals that are output from the second mixer 132 and the fourth mixer 134 to generate the single sideband quadrature-phase analog baseband signal QI'(t), as follows:

$$Q'(t) = (\tfrac{1}{2}[\sin(A+B)+\sin(A-B)]) - (\tfrac{1}{2}[\sin(A+B)-\sin(A-B)]) = \sin(A-B).$$

In this regard, the exemplary single sideband IQ modulator 130 of FIG. 1B converts the analog baseband components I(t) and Q(t) (with a baseband frequency $f_B$) to the single sideband analog components I'(t) and QI'(t), each with a center frequency of $f_{LO1}-f_B$ (lower sideband signal). In other embodiments, the first signal combiner 135 is configured to perform a subtraction operation, and the second signal combiner 136 is configured to perform an addition operation. In such embodiments, the single sideband IQ modulator 130 of FIG. 1B would convert the analog baseband components I(t) and Q(t) (with a baseband frequency $f_B$) to the single sideband analog components I'(t) and QI'(t), each with a center frequency of $f_{LO1}+f_B$ (upper sideband signal).

FIG. 1C schematically illustrates an exemplary embodiment of a quadrature phase shifter circuit 155 which can be implemented in the transmitter 100 to generate quadrature local oscillator (LO) signals. In particular, FIG. 1C schematically illustrates a quadrature phase shifter circuit 155 which is configured to receive an LO signal, LO2, as input, and generate the quadrature LO signals LO2-I and LO2-Q based on the LO2 input signal. In this configuration, the LO2-I signal comprises the same frequency and phase as the LO2 input signal, and the LO2-Q signal comprises the same frequency as the LO2 signal, but with a phase shift of 90 degrees. The quadrature phase shifter circuit 155 can be implemented using one of various quadrature phase shifting techniques known to those of ordinary skill in the art.

Figure 2:
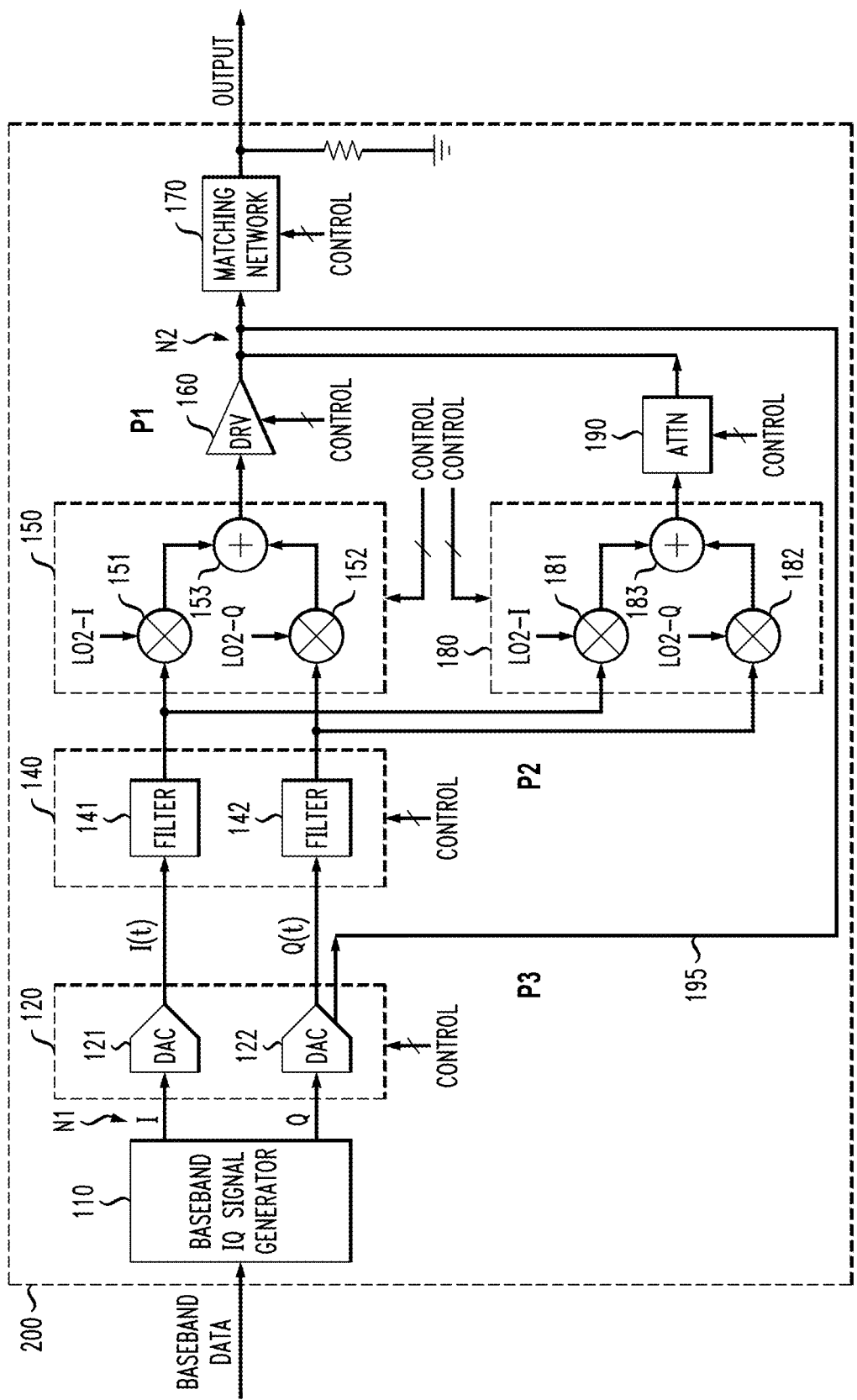
FIG. 2 schematically illustrates a transmitter, according to another exemplary embodiment of the disclosure.

FIG. 2 schematically illustrates a transmitter, according to another exemplary embodiment of the disclosure. In particular, FIG. 2 schematically illustrates a transmitter 200 which is similar to the transmitter 100 of FIG. 1A, except that the transmitter 200 does not implement the first modulation stage 130 as in FIG. 1A. In the exemplary embodiment of FIG. 2, the output of the DAC stage 120 is coupled to the input of the filter stage 140. In this configuration, the baseband frequency of the analog baseband signals I(t) and Q(t) are upconverted using the LO frequency of the second modulation stage 150 in the first signal path P1 when the first path P1 is selectively activated, or using the LO frequency of the third modulation stage 180 in the second signal path 180 when the second signal path P2 is selectively activated.

FIG. 3A schematically illustrate multi-channel transmitter, according to an exemplary embodiment of the disclosure. In particular, FIG. 3A schematically illustrates a transmitter 300 comprising a plurality (c) of transmitter channels 300-1, . . . , 300-c. The number c of transmitter channels will vary depending on the application. In some embodiments, each transmitter channel 300-1, . . . , 300-c comprises a similar circuit configuration comprising multiple signal paths P1, P2, and P2. For example, in some embodiments, as shown in FIG. 3A, each transmitter channel 300-1, . . . , 300-c comprises the same channel architecture as the single-channel transmitter 100 shown in FIG. 1A. In other embodiments, each transmitter channel 300-1, . . . , 300-c may comprise the same channel architecture as the single-channel transmitter 200 shown in FIG. 2.

FIG. 3A schematically illustrates an exemplary embodiment in which the different transmitter channels 300-1, . . . , 300-c are configured to operate at different center frequencies. More specifically, in some embodiments, the modulation stages 150 and 180 in the transmitter channel 300-1 are configured to perform IQ modulation using an LO frequency of LO2, while the modulation stages 150 and 180 in the transmitter channel 300-c are configured to perform IQ modulation using an LO frequency of LO-c, which is greater than LO2. In some embodiments, the different transmitter channels are configured to utilize different LO frequencies for the respective modulation stages 150 and 180.

This allows the multi-channel transmitter 300 to simultaneously transmit the information content of the digital IQ baseband signal, which is input to each of transmitter channels 300-1, . . . , 300-c, to different nodes which are configured to operate with different receiver center frequencies.

As further shown in FIG. 3A, antennas 310-1, . . . , 310-c are coupled to respective outputs of the transmitter channels 300-1, . . . , 300-c. In some embodiments the antennas 310-1, . . . , 310-c comprise individual antennas having respective antenna bandwidths which correspond to the RF output signal frequencies of the different transmitter channels 300-1, . . . , 300-c. In other embodiments, the transmitter channels 300-1, . . . , 300-c are coupled to a single, wideband antenna element having an antenna bandwidth which is configured to efficiently radiate energy at the RF output signal frequencies of the different transmitter channels 300-1, . . . , 300-c.

Figure 3B:
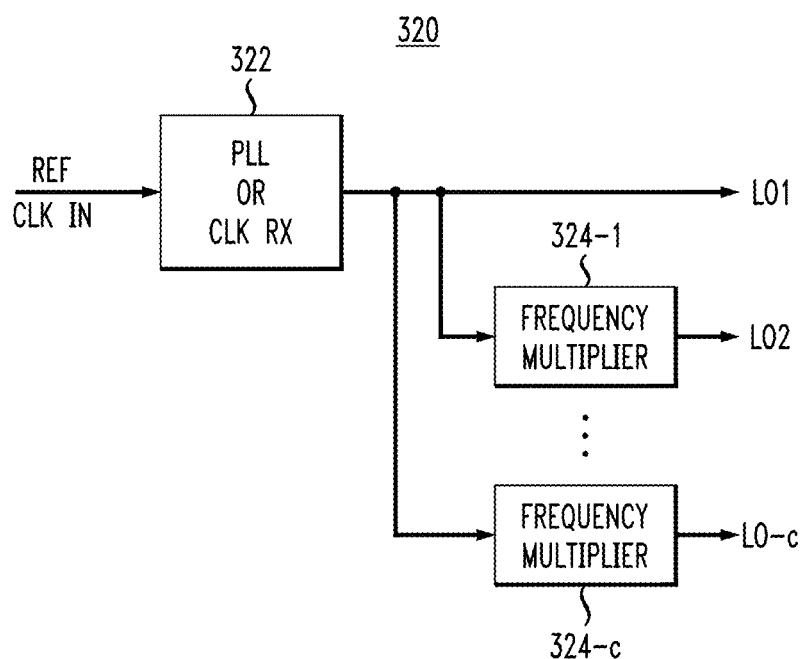
FIG. 3B schematically illustrate a LO signal generator circuit which can be implemented to generate different LO signals for the multi-channel transmitter of FIG. 3A, according to an exemplary embodiment of the disclosure.

FIG. 3B schematically illustrate a LO signal generator circuit 320 which can be implemented to generate different LO signals for the multi-channel transmitter of FIG. 3A, according to an exemplary embodiment of the disclosure. In some embodiments, the LO signal generator circuit 320 comprises a phase-locked loop (PLL) circuit 322 and a plurality of frequency multiplier circuits 324-1, . . . , 324-c, coupled to an output of the PLL circuit 322. The PLL circuit 322 is configured to receive a reference clock signal (REF CLK) as input and generate a first local oscillator signal LO1 which is distributed to an LO1 port of each transmitter channel 300-1, . . . , 300-c of the transmitter 300. In other embodiments, the LO1 signal is generated by a crystal oscillator and the block 322 serves as a distribution element to distribute the LO1 signal to each of the transmitter channels 300-1, . . . , 300-c. The LO1 signal is utilized to generate local quadrature signals LO1-I and LO1-Q in each transmitter channel 300-1, . . . , 300-c using a local quadrature phase shifter circuit (e.g., phase shifter 155, FIG. 1C). As noted above, in some embodiments, the quadrature signals LO1-I and LO1-Q are utilized by the first modulator stage 130 in each transmitter channel 300-1, . . . , 300-c.

The first local oscillator signal LO1 is input to each of the frequency multiplier circuits 324-1, . . . , 324-c, which generate respective LO signals LO2, . . . , LO-c that are used by the respective transmitter channels 300-1, . . . , 300-c to generate local quadrature signals LO2-I and LO2-Q, etc. In some embodiments, the frequency multiplier circuits 324-1, . . . , 324-c are disposed locally in the respective transmitter channels 300-1, . . . , 300-c and have input ports connected to the LO1 input port which receives the LO1 signal from the PLL circuit 322.

Figure 4:
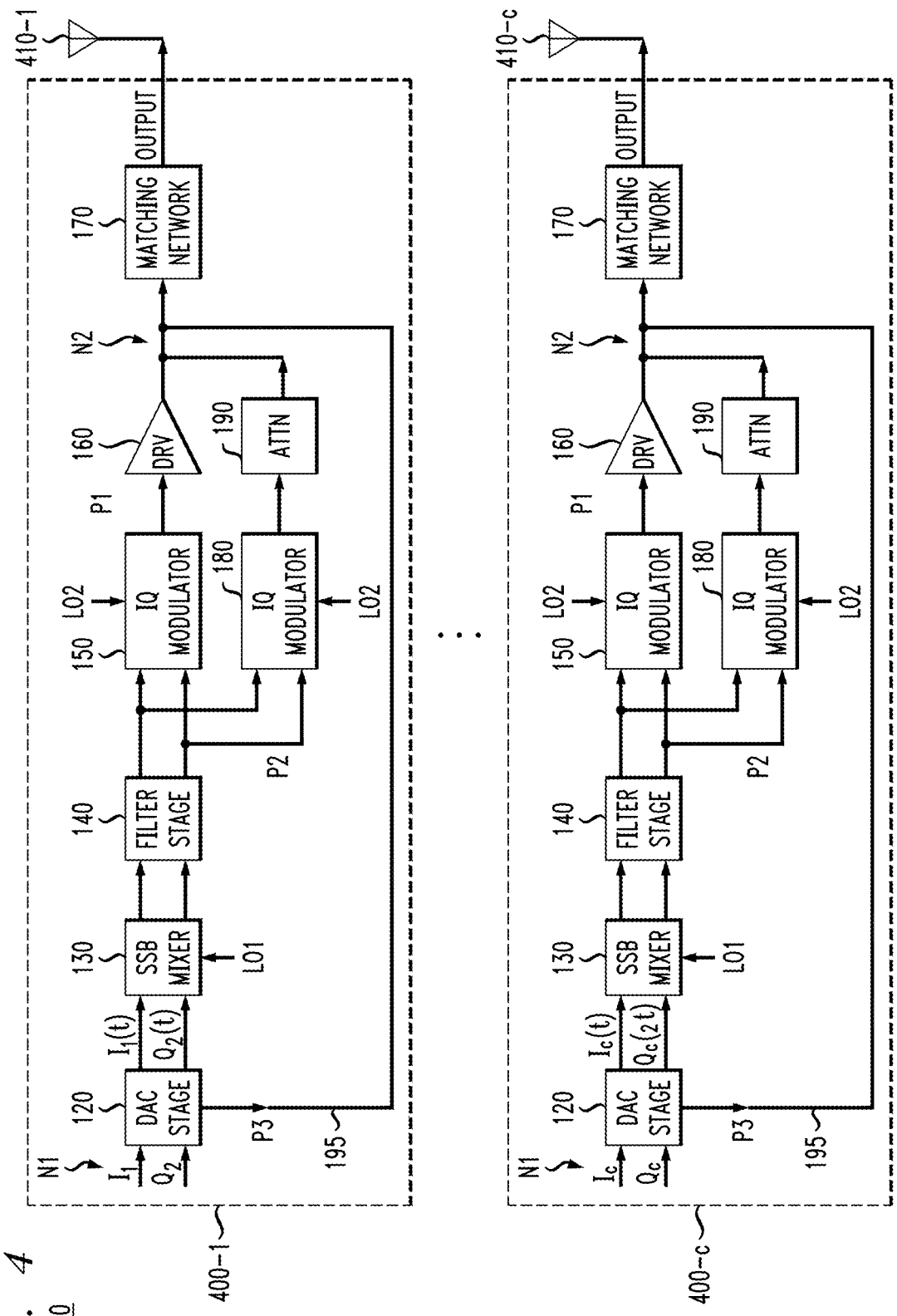
FIG. 4 schematically illustrates a multi-channel transmitter, according to another exemplary embodiment of the disclosure.

FIG. 4 schematically illustrates multi-channel transmitter, according to an exemplary embodiment of the disclosure. In particular, FIG. 4 schematically illustrates a transmitter 400 comprising a plurality (c) of transmitter channels 400-1, . . . , 400-c. The number c of transmitter channels will vary depending on the application. In some embodiments, each transmitter channel 400-1, . . . , 400-c comprises a similar transmitter circuit configuration comprising multiple signal paths P1, P2, and P2. For example, in some embodiments, as shown in FIG. 4, each transmitter channel 400-1, . . . , 400-c comprises the same channel architecture as the single-channel transmitter 100 shown in FIG. 1A. In other embodiments, each transmitter channel 400-1, . . . , 400-c may comprise the same channel architecture as the single-channel transmitter 200 shown in FIG. 2.

As further shown in FIG. 4, individual antenna elements 410-1, . . . , 410-c are coupled to respective outputs of the transmitter channels 400-1, . . . , 400-c. In some embodiments, the antenna elements 410-1, . . . , 410-c form an antenna array to implement a phased array antenna system in which a radiation pattern of each individual antenna element 410-1, . . . , 410-c constructively combines with neighboring antennas to form an effective radiation pattern called the main lobe. With a phased array antenna configuration, the main radiation lobe transmits energy in a desired direction (e.g., beam steering) location. On the other hand, the radiation pattern of each individual antenna element 410-1, . . . , 410-c destructively interfere with each other in undesired directions, forming nulls and side lobes. In this regard, the antenna array is designed to maximize the energy radiated in the main lobe while reducing the energy radiated in the side lobes to an acceptable level. The direction of the main lobe of radiation can be manipulated by changing the phase of the RF output signal that is fed into each individual antenna element 410-1, . . . , 410-c from the respective outputs of the transmitter channels 400-1, . . . , 400-c.

In some embodiments, the requisite phase delays of the RF output signals from the transmitter channels 400-1, . . . , 400-c is achieved in the digital domain by adding a delay to a digital IQ baseband signal that is input to the DAC stages 120 of the transmitter channels 400-1, . . . , 400-c. for example, as shown in FIG. 4, the transmitter channel 400-1 receives digital baseband signals $I_1$ and $Q_1$ and the transmitter channel 400-c receives digital baseband signals $I_C$ and $Q_C$, etc. The digital baseband signals $I_1/Q_1, \ldots, I_C/Q_C$ that are received by the respective transmitter channels 400-1, . . . , 400-c comprise the same IQ baseband signal in terms of information content, but where each transmitter channels 400-1, . . . , 400-c receives a different delayed version of the digital IQ baseband signal. The phase delay in the digital domain results in the generation of a plurality of corresponding phase-delayed RF output signals by the respective transmitter channels 400-1, . . . , 400-c, which are output to the antenna array (410-1, . . . , 410-c) to thereby generate a directional radiation beam which radiates from the antenna array.

Figure 5:
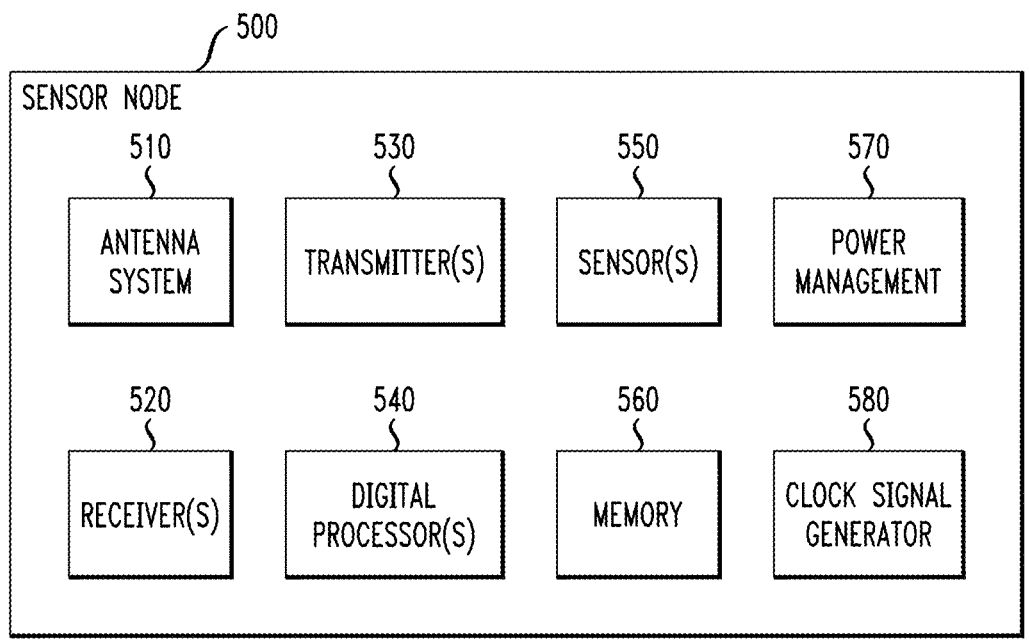
FIG. 5 schematically illustrates a sensor node which implements a transmitter, according to an exemplary embodiment of the disclosure.

FIG. 5 schematically illustrates a sensor node which implements a transmitter, according to an exemplary embodiment of the disclosure. More specifically, FIG. 5 schematically illustrates a sensor node 500 which comprises an antenna system 510, one or more receivers 520 (e.g., single or multi-channel receiver), one or more transmitters 530 (e.g., single or multi-channel transmitter), one or more digital processors 540, one or more sensors 550, memory 560, a power management system 570, and a clock generator 580. In some embodiments, the sensor node 500 comprises a node in a sensor network that is configured to collect and process sensor information and communicate with other nodes (e.g., sensor nodes, computing nodes, etc.) in a network.

The antenna system 510 comprises one or more antenna elements (e.g., wideband antenna, narrow band antenna elements, antenna array, etc.) antenna feed elements and networks, diplexers, duplexers, etc. In some embodiments, the antenna system 510 comprises printed antenna elements, or discrete elements such as whip antennas, etc. The receivers 520 and transmitters 530 collective provide a transceiver system which is coupled to the antenna system 510. In some embodiments, the transmitter 530 is implemented using one of the exemplary transmitter architectures as discussed above (e.g., FIGS. 1A, 1B, 1C, 2, 3A, 3B, 4, etc.).

The digital processors 540 include one or more processors such as CPUs, microcontrollers, digital signal processors, ASICs, FPGAs, etc., which are configured to control operations of the sensor node 500 and components thereof, and to collect and process sensor data. In particular, in some embodiments, the digital processors 540 include a microcontroller that is configured to generate the digital control signals that are input to the various signal processing stages of the transmitters shown in, e.g., FIGS. 1A, 2, 3A, and 4, to (i) control powering up and powering down of the different signal paths P1, P2, and P3, and to (i) configure the hardware configurations of the stages to change the operating parameters, e.g., adjust gain, control LO frequencies, etc.

The sensors 550 are utilized to capture data within a given environment. For example, the sensors 550 include hardware device that generate a measurable signal in response to a change in physical conduction such as temperature, pressure, humidity, light, etc. In some embodiments, the sensors 550 generates analog signals that are digitized and processed by a digital signal processor. In some embodiments, the sensor data is transmitted to a remote node by converting the digital sensor data to digital IQ baseband signals (e.g., via element 110, FIG. 1A) and upconverted to an RF output signal via the transmitters 530 for wireless transmission via the antenna system 510.

The memory 560 includes volatile memory (e.g., RAM, cache) which is utilized by the digital processors 540, and non-volatile memory such as flash memory for storing sensor and application related data, and for storing software or code for programming the various components of the sensor node 500 and controlling operations and functions of the sensor node 500.

The power management system 570 comprises various elements such as a power supply (e.g., batteries, capacitors), a voltage regulation circuit, and a power management system such as a dynamic power management (DPM) system which is configured to power down components of the sensor node 500 which are currently inactive and not in use, or a dynamic voltage scaling (DVS) system, which is configured to adjust operating power levels and/or operating frequencies within the sensor node 500 to reduce power consumption.

The clock signal generator system 580 comprises various components and circuits to generate and distribute clock signals for operating the sensor node 500. For example, in some embodiments, the clock signal generator system 580 implement the LO clock signal generator system 300 as shown in FIG. 3B.

Figure 6:
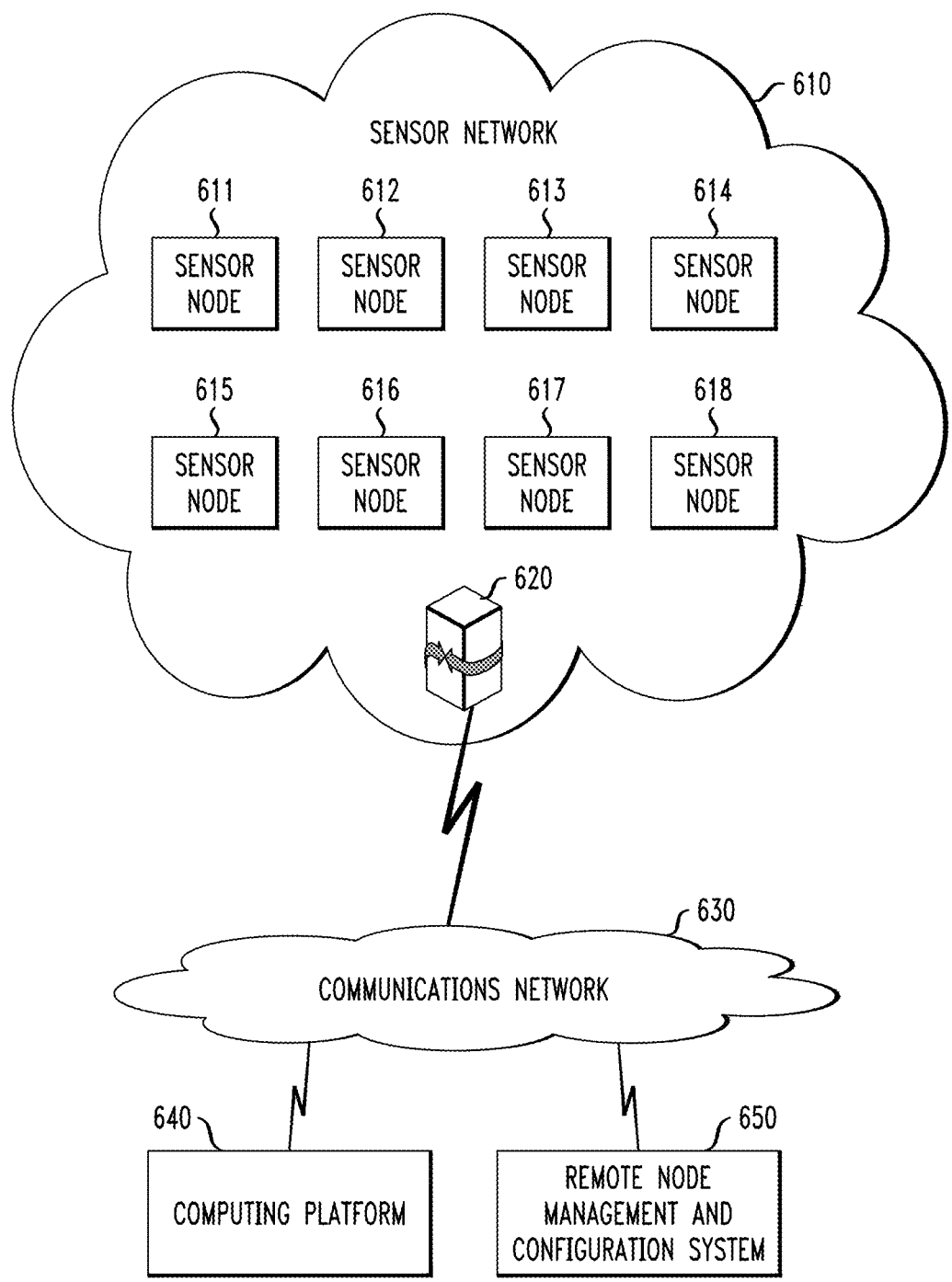
FIG. 6 schematically illustrates a computing system comprising a network of sensor nodes which implement transmitters, according to an exemplary embodiment of the disclosure.

FIG. 6 schematically illustrates a computing system comprising a network of sensor nodes which implement transmitters, according to an exemplary embodiment of the disclosure. More specifically, FIG. 6 is a high-level schematic illustration of a computing system 600 which comprises a sensor network 610, a communications network 630, a computing platform 640, and a sensor node management and configuration system 650. The computing platform 640 and node management and configuration system 650 are coupled to the sensor network 610 via the communications network 630. The communications network 630 may comprise, for example, a global computer network such as the Internet, a wide area network (WAN), a local area network (LAN), a satellite network, a telephone or cable network, a cellular network, a wireless network such as Wi-Fi or WiMAX, or various portions or combinations of these and other types of networks.

The sensor network 610 comprises a plurality of sensor nodes 611, 612, 613, 614, 615, 616, 617, and 618 and a gateway 620. The sensor nodes 611, 612, 613, 614, 615, 616, 617, and 618 collectively generate data that is transmitted to, and utilized by, the computing platform 640 to execute one or more applications. In some embodiments, the sensor nodes 611, 612, 613, 614, 615, 616, 617, and 618 each comprises a sensor node framework such as shown in FIG. 5. In some embodiments, sensor network 610 deploys wireless sensor nodes to implement a given Internet-of-Things (IoT) application The computing platform 640 comprises one or more application server nodes and a data storage system, wherein the application server nodes host one or more applications that process the data that is generated by the sensor nodes of the sensor network 610 to provide one or more services. In some embodiments, the computing platform 640 comprises an IoT cloud computing system that is configured to support one or more IoT application domains (e.g., healthcare, energy, manufacturing, etc.). The computing platform 640 manages and processes IoT data received from sensor nodes of the sensor network 610 for a given application domain, or from multiple sensor networks for different application domains. For an IoT application, the computing platform 640 performs data processing and storage functions to support one or more IoT cloud computing applications.

The remote node management and configuration system 650 allows a sensor network administrator to remotely configure the sensor nodes in the sensor network 610. Such configuration includes configuration of reconfigurable hardware in the sensor nodes, and software/firmware configuration of the sensor nodes. For example, in some embodiments, the remote node management and configuration system 650 is configured to allow an administrator to command the microcontrollers of the sensor nodes to selectively activate and deactivate the different signal paths P1, P2, and P3 of the transmitters of the sensor nodes, as desired, for a given application or deployment environment.

Exemplary embodiments of the present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 7:
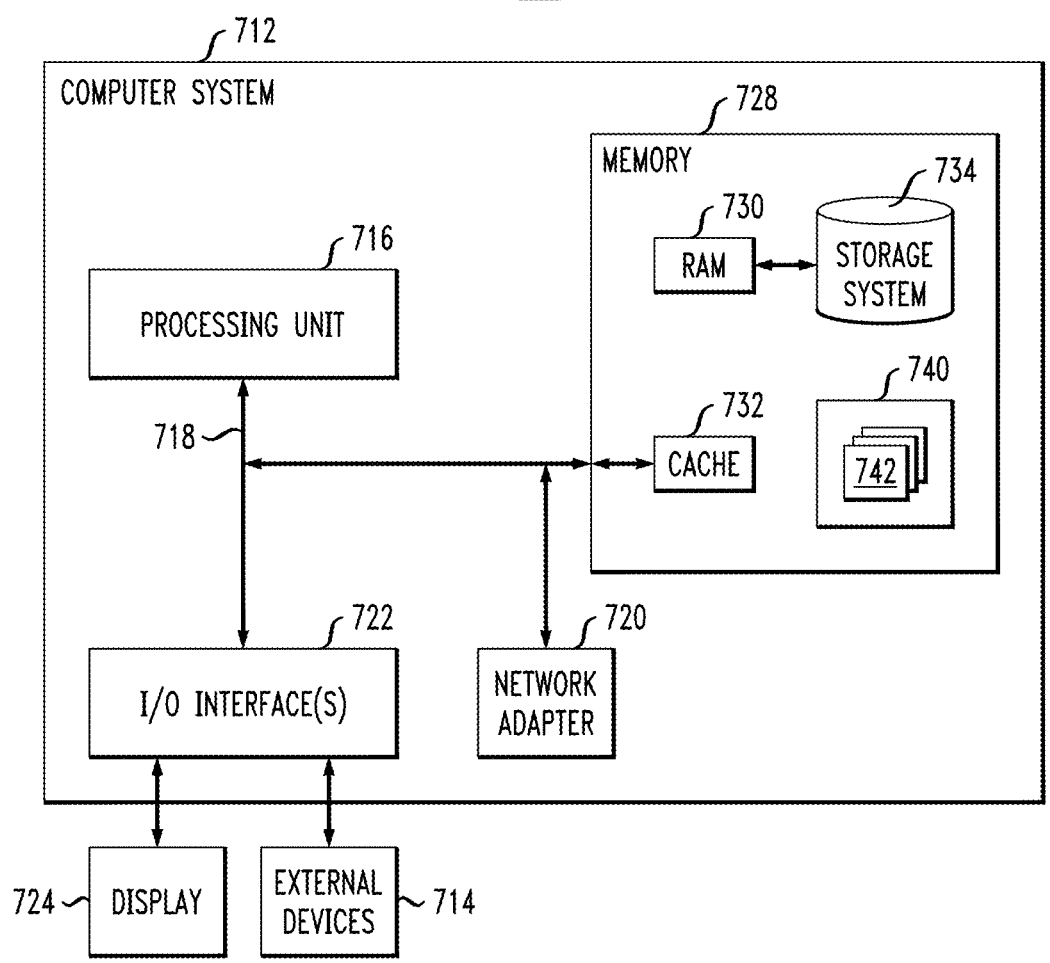
FIG. 7 schematically illustrates an exemplary architecture of a computing node which can host and execute a program for managing and configuring sensor nodes comprising transmitter systems, according to an exemplary embodiment of the disclosure.

These concepts are illustrated with reference to FIG. 7, which schematically illustrates an exemplary architecture of a computing node which can host and execute a program for managing and configuring sensor nodes comprising transmitter systems, according to an exemplary embodiment of the disclosure. In some embodiments, FIG. 7 schematically illustrates a computing node 700 which is configured to host and execute the remote node management and configuration system 650 of FIG. 6. As shown in FIG. 7, the computing node 700 which comprises a computer system/server 712, which is operational with numerous other general purpose or special purpose computing system environments or configurations. Examples of well-known computing systems, environments, and/or configurations that may be suitable for use with computer system/server 712 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like. in some embodiments, the remote node management and configuration system 650

Computer system/server 712 may be described in the general context of computer system executable instructions, such as program modules, being executed by a computer system. Generally, program modules may include routines, programs, objects, components, logic, data structures, and so on that perform particular tasks or implement particular abstract data types. Computer system/server 712 may be practiced in distributed cloud computing environments where tasks are performed by remote processing devices that are linked through a communications network. In a distributed cloud computing environment, program modules may be located in both local and remote computer system storage media including memory storage devices.

In FIG. 7, computer system/server 712 in computing node 700 is shown in the form of a general-purpose computing device. The components of computer system/server 712 may include, but are not limited to, one or more processors or processing units 716, a system memory 728, and a bus 718 that couples various system components including system memory 728 to the processors 716.

The bus 718 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

The computer system/server 712 typically includes a variety of computer system readable media. Such media may be any available media that is accessible by computer system/server 712, and it includes both volatile and non-volatile media, removable and non-removable media.

The system memory 728 can include computer system readable media in the form of volatile memory, such as RAM 730 and/or cache memory 732. The computer system/server 712 may further include other removable/non-removable, volatile/nonvolatile computer system storage media. By way of example only, storage system 734 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 718 by one or more data media interfaces. As depicted and described herein, memory 728 may include at least one program product having a set (e.g., at least one) of program modules that are configured to carry out the functions of embodiments of the invention.

The program/utility 740, having a set (at least one) of program modules 742, may be stored in memory 728 by way of example, and not limitation, as well as an operating system, one or more application programs, other program modules, and program data. Each of the operating system, one or more application programs, other program modules, and program data or some combination thereof, may include an implementation of a networking environment. Program modules 742 generally carry out the functions and/or methodologies of embodiments of the disclosure as described herein.

Computer system/server 712 may also communicate with one or more external devices 714 such as a keyboard, a pointing device, a display 724, etc., one or more devices that enable a user to interact with computer system/server 712, and/or any devices (e.g., network card, modem, etc.) that enable computer system/server 712 to communicate with one or more other computing devices. Such communication can occur via Input/Output (I/O) interfaces 722. Still yet, computer system/server 712 can communicate with one or more networks such as a local area network (LAN), a general wide area network (WAN), and/or a public network (e.g., the Internet) via network adapter 720. As depicted, network adapter 720 communicates with the other components of computer system/server 712 via bus 718. It should be understood that although not shown, other hardware and/or software components could be used in conjunction with computer system/server 712. Examples, include, but are not limited to: microcode, device drivers, redundant processing units, external disk drive arrays, RAID systems, SSD drives, and data archival storage systems, etc.

Additionally, it is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 8:
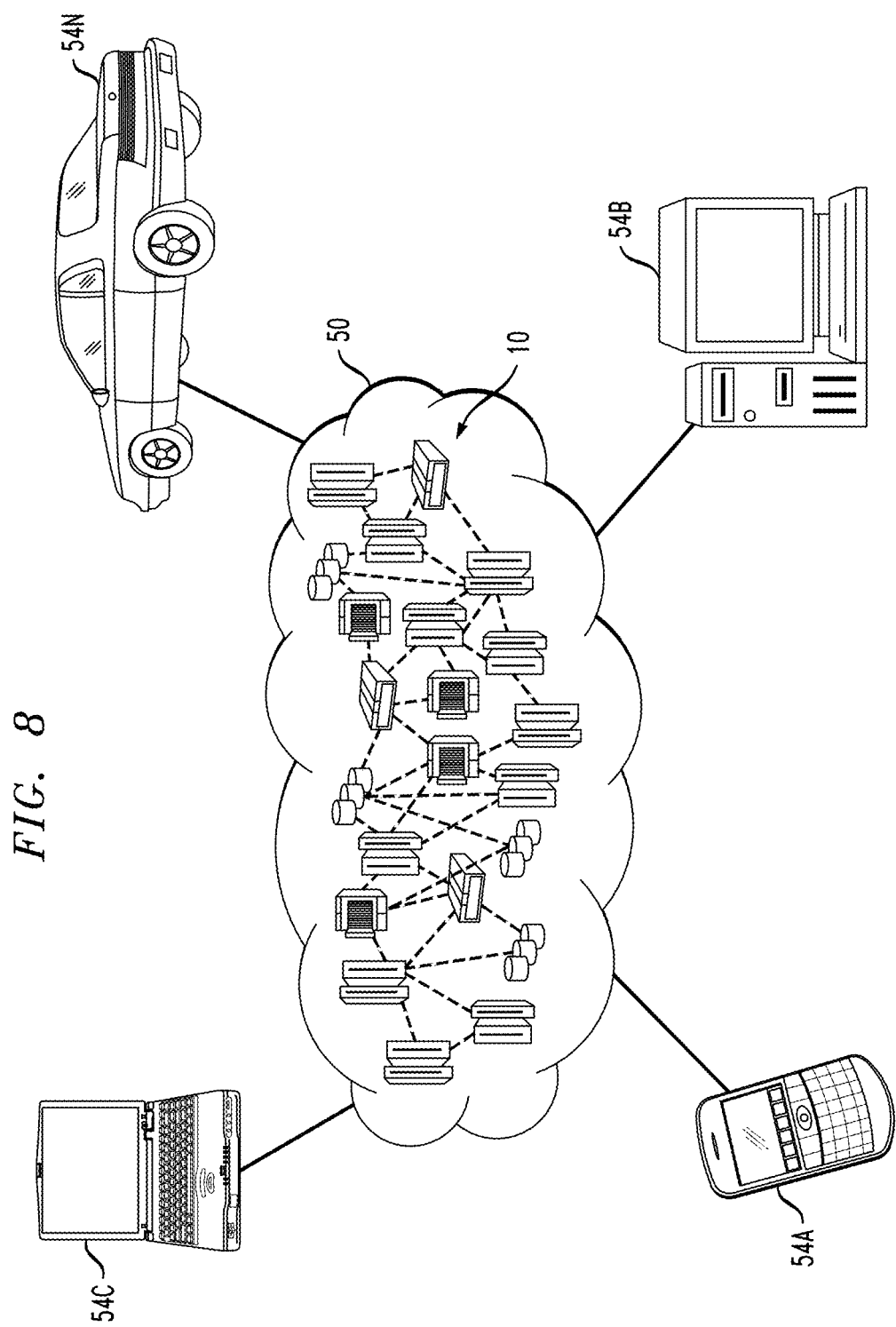
FIG. 8 depicts a cloud computing environment according to an exemplary embodiment of the disclosure.

Referring now to FIG. 8, an illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 8 are intended to be illustrative only and that computing nodes 10 and cloud computing environment 50 can communicate with any type of computerized device over any type of network and/or network addressable connection (e.g., using a web browser).

Figure 9:
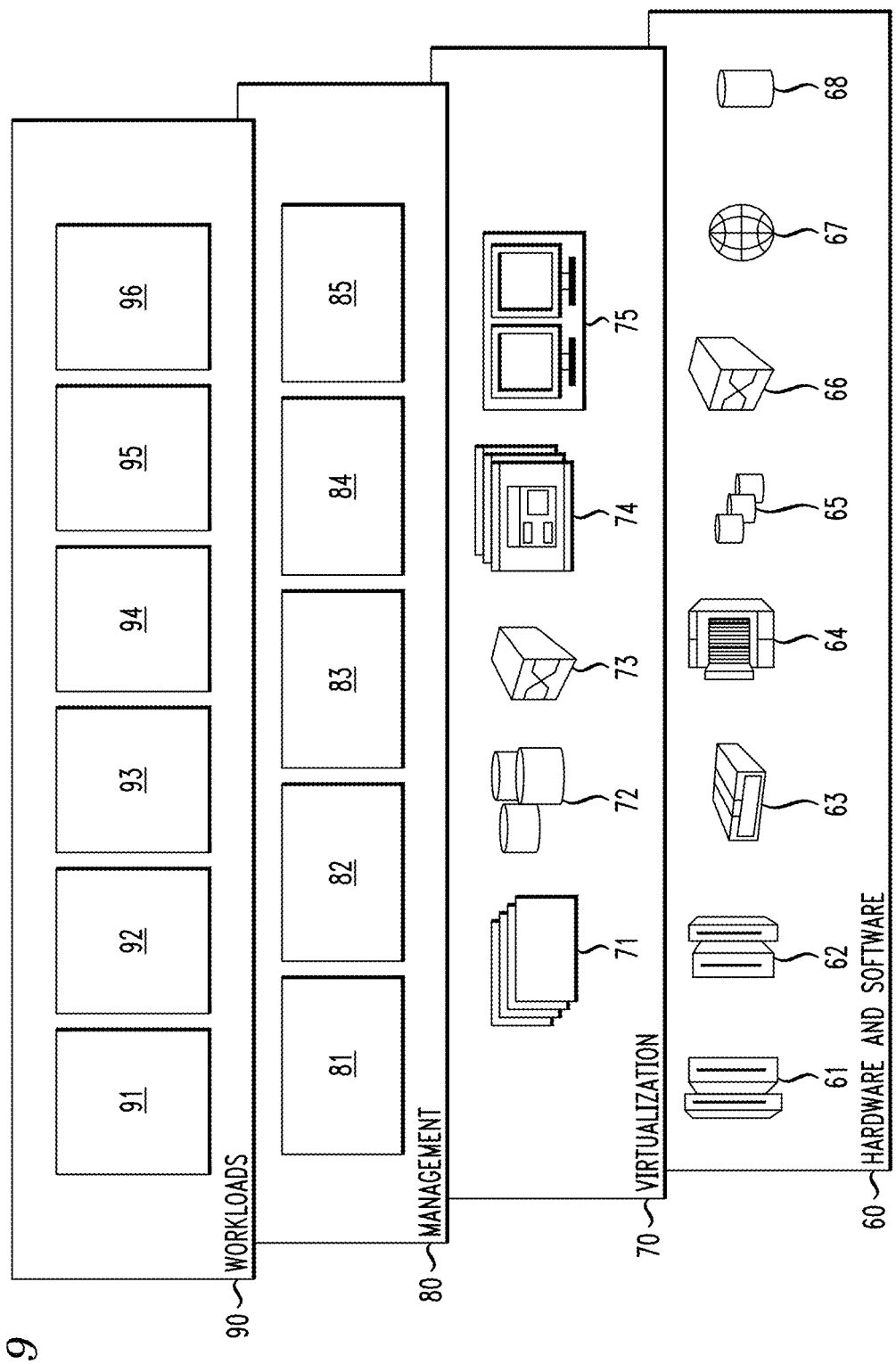
FIG. 9 depicts abstraction model layers according to an exemplary embodiment of the disclosure.

Referring now to FIG. 9, a set of functional abstraction layers provided by cloud computing environment 50 (FIG. 8) is shown. It should be understood in advance that the components, layers, and functions shown in FIG. 9 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and various functions 96 for selectively activating and/or configuring the signal paths P1, P2, and P3, and other components of the transmitters of sensor nodes within a sensor network.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus, comprising:
a plurality of signal paths for signal transmission, wherein the plurality of signal paths comprises:
a first signal path that is configured to convert a digital baseband signal to a first radio frequency (RF) signal having a first frequency and a first gain;
a second signal path that is configured to convert a digital baseband signal to a second RF signal having a second frequency and a second gain, wherein the second gain is less than the first gain; and
a third signal path that is configured to convert a digital baseband signal to an analog baseband signal having a baseband frequency;
control circuitry coupled to the plurality of signal paths and configured to receive one or more control signals to enable selective activation of at least one signal path of the plurality of signal paths to selectively output for transmission at least one the first RF signal, the second RF signal, and the analog baseband signal.

2. The apparatus of claim 1, wherein the third signal path comprises an interconnect network which couples an output of a digital-to-analog converter (DAC) stage to an output node.

3. The apparatus of claim 1, wherein the first frequency and the second frequency are substantially the same.

4. The apparatus of claim 1, wherein the first frequency is greater than the second frequency, and wherein the baseband frequency is less than the first frequency and the second frequency.

5. The apparatus of claim 1, comprising:
a digital-to-analog converter (DAC) stage comprising an input that is configured to receive a digital baseband signal;
a filter stage comprising an input that is coupled to an output of the DAC stage;
a first modulation stage comprising an input that is coupled to an output of the filter stage;
an amplifier driver stage comprising an input that is coupled to an output of the first modulation stage, and an output that is coupled to an output node;
a second modulation stage comprising an input that is coupled to the output of the filter stage; and
a gain attenuation stage comprising an input that is coupled to an output of the second modulation stage, and an output that is coupled to the output node;
wherein the first signal path comprises the DAC stage, the filter stage, the first modulation stage, and the amplifier driver stage;
wherein the second signal path comprises the DAC stage, the filter stage, the second modulation stage, and the gain attenuation stage; and
wherein the third signal path comprises the DAC stage and an interconnect network which couples the output of the DAC stage to the output node.

6. The apparatus of claim 5, wherein the interconnect network comprises one or more of resistive, inductive, and capacitive components that are configured to filter the analog baseband signal in the third signal path.

7. The apparatus of claim 5, further comprising a third modulation stage comprising an input that is coupled to the output of the DAC stage, and an output that is coupled to the input of the filter stage, wherein the first and second signal paths each comprise the third modulation stage.

8. The apparatus of claim 7, wherein:
the DAC stage is configured to convert a digital baseband signal to an analog baseband signal, wherein the analog baseband signal is generated using a DAC sampling frequency which corresponds to the baseband frequency;
the third modulation stage is configured to mix the analog baseband signal with a first local oscillator (LO) signal to thereby generate a first modulated signal, wherein the first LO signal has a first LO frequency which is greater than the DAC sampling frequency;
the filter stage is configured to filter the first modulated signal to thereby generate a filtered analog signal;
the first modulation stage is configured to mix the filtered analog signal with a second LO signal to thereby generate a second modulated signal, wherein the second LO signal has a second LO frequency which is greater than the first LO frequency; and
the second modulation stage is configured to mix the filtered analog signal with a third LO signal LO signal to thereby generate a third modulated signal, wherein the third LO signal has a third LO frequency which is greater than the first LO frequency.

9. The apparatus of claim 1, further comprising an impedance matching network comprising an input that is coupled to an output of each signal path of the plurality of signal paths.

10. The apparatus of claim 1, wherein one or more of the signal paths comprises a respective current-mode output stage coupled to an output node, wherein the respective current-mode output stages apply substantially a same load impedance on the output node.

11. The apparatus of claim 1, wherein the apparatus comprises a radio frequency analog quadrature transmitter.

12. An apparatus, comprising:
a plurality of signal paths for signal transmission, wherein the plurality of signal paths comprises:
a first signal path configured to convert a digital baseband signal to a first radio frequency (RF) signal having a first frequency and a first gain; and
a second signal path configured to convert a digital baseband signal to an analog baseband signal having a baseband frequency and a second gain which is less than the first gain; and
control circuitry coupled to the plurality of signal paths and configured to receive one or more control signals to enable selective activation of at least one signal path of the plurality of signal paths to selectively output for transmission at least one the first RF signal and the analog baseband signal.

13. The apparatus of claim 12, comprising:
a digital-to-analog converter (DAC) stage comprising an input that is configured to receive a digital baseband signal;
a filter stage comprising an input that is coupled to an output of the DAC stage;
a first modulation stage comprising an input that is coupled to an output of the filter stage;
an amplifier driver stage comprising an input that is coupled to an output of the first modulation stage, and an output that is coupled to an output node; and
an interconnect network which couples the output of the DAC stage to the output node; and
an impedance matching network having an input connected to the output node;
wherein the first signal path comprises the DAC stage, the filter stage, the first modulation stage, and the amplifier driver stage; and wherein the second signal path comprises the DAC stage and the interconnect network which couples the output of the DAC stage to the output node.

14. The apparatus of claim 13, wherein:
the DAC stage is configured to convert a digital baseband signal to an analog baseband signal, wherein the analog baseband signal is generated using a DAC sampling frequency which corresponds to the baseband frequency;
the filter stage is configured to filter the analog baseband to thereby generate a filtered analog signal;
the first modulation stage is configured to mix the filtered analog signal with a first local oscillator (LO) signal to thereby generate a first modulated signal, wherein the first LO signal has a first LO frequency which is greater than the baseband frequency; and
the impedance matching network is configured to filter the analog baseband signal output from the DAC stage, and generate a filtered analog baseband signal which is selectively output for transmission.

15. The apparatus of claim 12, wherein one or more of the signal paths comprises a respective current-mode output stage coupled to an output node, wherein the respective current-mode output stages apply substantially a same load impedance on the output node.

16. The apparatus of claim 12, wherein the apparatus comprises a radio frequency analog quadrature transmitter.

17. An apparatus, comprising:
a plurality of transmitter channels comprising at least a first transmitter channel, and a second transmitter channel, wherein each of the first and second transmitter channels comprises:
a plurality of signal paths for signal transmission, wherein the plurality of signal paths comprises:
a first signal path that is configured to convert a digital baseband signal to a first radio frequency (RF) signal having a first frequency and a first gain;
a second signal path that is configured to convert a digital baseband signal to a second RF signal having a second frequency and a second gain, wherein the second gain is less than the first gain; and
a third signal path that is configured to convert a digital baseband signal to an analog baseband signal having a baseband frequency;
control circuitry coupled to the plurality of signal paths and configured to receive one or more control signals to enable selective activation of at least one signal path of the plurality of signal paths to selectively output for transmission at least one the first RF signal, the second RF signal, and the analog baseband signal.

18. The apparatus of claim 17, wherein each of the first and second transmitter channels comprises:
a digital-to-analog converter (DAC) stage comprising an input which is configured to receive a digital baseband signal;
a filter stage comprising an input that is coupled to an output of the DAC stage;
a first modulation stage comprising an input that is coupled to an output of the filter stage;
an amplifier driver stage comprising an input that is coupled to an output of the first modulation stage, and an output that is coupled to an output node;
a second modulation stage comprising an input that is coupled to the output of the filter stage; and
a gain attenuation stage comprising an input that is coupled to an output of the second modulation stage, and an output that is coupled to the output node;

wherein the first signal path comprises the DAC stage, the filter stage, the first modulation stage, and the amplifier driver stage;
wherein the second signal path comprises the DAC stage, the filter stage, the second modulation stage, and the gain attenuation stage; and
wherein the third signal path comprises the DAC stage and an interconnect network which couples the output of the DAC stage to the output node.

19. The apparatus of claim 18, wherein:
the first and second modulation stages of the first transmitter channel are configured to generate a modulated signal using a first local oscillator (LO) signal having a first frequency;
the first and second modulation stage of the second transmitter channel are configured to generate a modulated signal using a second LO signal having a second frequency; and
wherein the first and second frequencies are different frequencies.

20. The apparatus of claim 17, wherein the apparatus comprises a radio frequency analog quadrature transmitter.

21. An apparatus, comprising:
a plurality of transmitter channels comprising at least a first transmitter channel, and a second transmitter channel, wherein each of the first and second transmitter channels comprises:
a plurality of signal paths for signal transmission, wherein the plurality of signal paths comprises:
a first signal path that is configured to convert a digital baseband signal to a first radio frequency (RF) signal having a first frequency and a first gain; and
a second signal path that is configured to convert a digital baseband signal to a second RF signal having a second frequency and a second gain, wherein the second gain is less than the first gain; and
control circuitry coupled to the plurality of signal paths and configured to receive one or more control signals to enable selective activation of at least one signal path of the plurality of signal paths;
an antenna array coupled to an output of each transmitter channel of the plurality of transmitter channels;
wherein each transmitter channel of the plurality of transmitter channels is configured to receive a different delayed version of a digital baseband signal and generate a corresponding phase-delayed RF signal, and output the corresponding phase-delayed RF signal to the antenna array to thereby generate a directional radiation beam which radiates from the antenna array.

22. A sensor node, comprising:
at least one sensor device which generates sensor data; and
a transmitter configured to transmit the sensor data to a remote node, wherein the transmitter comprises:
a plurality of signal paths for signal transmission, wherein the plurality of signal paths comprises:
a first signal path that is configured to convert a digital baseband signal to a first radio frequency (RF) signal having a first frequency and a first gain;
a second signal path that is configured to convert a digital baseband signal to a second RF signal having a second frequency and a second gain, wherein the second gain is less than the first gain; and a third signal path that is configured to convert a digital baseband signal to an analog baseband signal having a baseband frequency;

control circuitry coupled to the plurality of signal paths and configured to receive one or more control signals to enable selective activation of at least one signal path of the plurality of signal paths to selectively output for transmission at least one the first RF signal, the second RF signal, and the analog baseband signal.

23. The sensor node of claim 22, wherein the third signal path comprises an interconnect network which couples an output of a digital-to-analog converter (DAC) stage to an output node, and wherein the baseband frequency is less than the first frequency and the second frequency.

24. A method comprising:

receiving, by a transmitter, one or more control signals which are configured to control activation and deactivation of a plurality of signal paths for transmission, wherein the plurality of signal paths comprises a first signal path that is configured to convert a digital baseband signal to a first radio frequency (RF) signal having a first frequency and a first gain, a second signal path that is configured to convert a digital baseband signal to a second RF signal having a second frequency and a second gain, wherein the second gain is less than the first gain, and a third signal path that is configured to convert a digital baseband signal to an analog baseband signal having a baseband frequency; and utilizing, by the transmitter, the one or more control signals to selectively activate at least one signal path of the plurality of signal paths to selectively generate and output for transmission at least one the first RF signal, the second RF signal, and the analog baseband signal; and utilizing, by the transmitter, the one or more control signal to deactivate one or more signal paths of the plurality of signal paths which are not selected for activation.

25. The method of claim 24, wherein the third signal path comprises an interconnect network which couples an output of a digital-to-analog converter (DAC) stage to an output node, and wherein the baseband frequency is less than the first frequency and the second frequency.

* * * * *